(12) United States Patent
Mizukami

(10) Patent No.: US 10,160,208 B2
(45) Date of Patent: Dec. 25, 2018

(54) ELECTROMECHANICAL-TRANSDUCING ELECTRONIC COMPONENT, LIQUID DISCHARGE HEAD, LIQUID DISCHARGE DEVICE, AND LIQUID DISCHARGE APPARATUS

(71) Applicant: Satoshi Mizukami, Kanagawa (JP)

(72) Inventor: Satoshi Mizukami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/484,286

(22) Filed: Apr. 11, 2017

(65) Prior Publication Data

US 2017/0291419 A1    Oct. 12, 2017

(30) Foreign Application Priority Data

Apr. 11, 2016  (JP) ................... 2016-079052
Apr. 11, 2016  (JP) ................... 2016-079054
Feb. 13, 2017  (JP) ................... 2017-024503

(51) Int. Cl.
*B41J 2/14*       (2006.01)
*H01L 41/18*     (2006.01)
(Continued)

(52) U.S. Cl.
CPC ...... *B41J 2/14209* (2013.01); *H01L 41/0815* (2013.01); *H01L 41/09* (2013.01); *H01L 41/183* (2013.01)

(58) Field of Classification Search
None
See application file for complete search history.

(56) References Cited

U.S. PATENT DOCUMENTS

2005/0212867 A1*  9/2005  Nagashima .......... B41J 2/14233
                                                            347/71
2009/0290002 A1* 11/2009  Katoh ...................... B41J 2/175
                                                            347/85
(Continued)

FOREIGN PATENT DOCUMENTS

JP       2006-278835      10/2006
JP       2008-192868       8/2008
(Continued)

*Primary Examiner* — Erica Lin
(74) *Attorney, Agent, or Firm* — Cooper & Dunham LLP

(57) ABSTRACT

An electromechanical-transducing electronic component includes at least one element array of electromechanical transducer elements. A piezoelectric material of each transducer element is made of a composite oxide having a perovskite structure preferentially oriented to at least one of (100) and (001) planes and has a drop of diffraction intensity in a rocking curve corresponding to at least one of (200) and (002) planes measured at a position (2θ=θmax) of a diffraction peak intensity P where the diffraction intensity is largest in a diffraction intensity peak corresponding to the at least one of the (200) and (002) planes out of diffraction intensity peaks measured by an X-ray diffraction θ-2θ method. $\Delta P/P_{AVE}$ is 20% or less where $P_{AVE}$ represents an average of the intensity P in the element array in the piezoelectric material of each transducer element and $\Delta P$ represents a maximum difference of the intensity P in the array.

10 Claims, 13 Drawing Sheets

(51) Int. Cl.
*H01L 41/09* (2006.01)
*H01L 41/08* (2006.01)

(56) References Cited

U.S. PATENT DOCUMENTS

| | | |
|---|---|---|
| 2011/0074890 A1* | 3/2011 | Miyazawa .......... H01L 41/0831 347/71 |
| 2011/0090289 A1 | 4/2011 | Mizukami |
| 2012/0206545 A1 | 8/2012 | Kato et al. |
| 2012/0212545 A1 | 8/2012 | Mizukami et al. |
| 2012/0229573 A1 | 9/2012 | Mizukami et al. |
| 2012/0236083 A1 | 9/2012 | Mizukami et al. |
| 2013/0002767 A1 | 1/2013 | Mizukami et al. |
| 2013/0070029 A1 | 3/2013 | Mizukami et al. |
| 2013/0093288 A1* | 4/2013 | Fox .................... C30B 23/02 310/348 |
| 2013/0162726 A1 | 6/2013 | Mizukami et al. |
| 2013/0250007 A1 | 9/2013 | Ishimori et al. |
| 2013/0250009 A1 | 9/2013 | Ishimori et al. |
| 2014/0284302 A1* | 9/2014 | Hahiro ................ H01L 41/332 216/13 |
| 2015/0022592 A1* | 1/2015 | Aoyama ............. B41J 2/14233 347/68 |
| 2015/0077475 A1 | 3/2015 | Mizukami et al. |
| 2015/0263263 A1 | 9/2015 | Akiyama et al. |
| 2015/0266296 A1 | 9/2015 | Mizukami et al. |
| 2015/0349240 A1 | 12/2015 | Mizukami |
| 2016/0099402 A1 | 4/2016 | Mizukami et al. |
| 2016/0167383 A1 | 6/2016 | Mizukami |
| 2016/0236470 A1 | 8/2016 | Mizukami |
| 2016/0263892 A1 | 9/2016 | Mizukami |
| 2016/0263893 A1 | 9/2016 | Mizukami et al. |
| 2016/0351788 A1 | 12/2016 | Mizukami |

FOREIGN PATENT DOCUMENTS

| | | |
|---|---|---|
| JP | 2009-286118 | 12/2009 |
| JP | 2009-286119 | 12/2009 |
| JP | 2009-286120 | 12/2009 |
| JP | 2012-009677 | 1/2012 |
| JP | 2012-253161 | 12/2012 |
| JP | 2015-023053 | 2/2015 |
| JP | 2015-225957 | 12/2015 |
| JP | 2016-004996 | 1/2016 |
| JP | 2016-115755 | 6/2016 |

* cited by examiner

ELECTROMECHANICAL-TRANSDUCING ELECTRONIC COMPONENT, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application Nos. 2016-079052, filed on Apr. 11, 2016, 2016-079054, filed on Apr. 11, 2016, and 2017-024503, filed on Feb. 13, 2017, in the Japan Patent Office, the entire disclosure of each of which is hereby incorporated by reference herein.

BACKGROUND

Technical Field

Embodiments of the present disclosure relate to an electromechanical-transducing electronic component, a liquid discharge head, a liquid discharge device, and a liquid discharge apparatus.

Related Art

An image forming apparatus, such as an inkjet recording apparatus, may include an electromechanical-transducing electronic component in which a plurality of electromechanical transducer elements is arrayed to displace a displacement plate constituting a wall surface of a liquid chamber to discharge liquid from the liquid chamber through discharge orifices in accordance with a drive signal.

SUMMARY

In an aspect of the present disclosure, there is provided an electromechanical-transducing electronic component that includes at least one element array in which a plurality of electromechanical transducer elements are arrayed. Each of the plurality of electromechanical transducer elements includes a first electrode, a piezoelectric material on the first electrode, and a second electrode on the piezoelectric material. Each of the plurality of electromechanical transducer elements is configured to apply a voltage according to a drive signal between the first electrode and the second electrode to deform the piezoelectric material. The piezoelectric material is made of a composite oxide having a perovskite structure preferentially oriented to at least one of a (100) plane and a (001) plane and has a drop of diffraction intensity in a rocking curve corresponding to at least one of a (200) plane and a (002) plane measured at a position ($2\theta=\theta$max) of a diffraction peak intensity P where the diffraction intensity is largest in a diffraction intensity peak corresponding to the at least one of the (200) plane and the (002) plane out of diffraction intensity peaks measured by an X-ray diffraction $\theta$-$2\theta$ method. $\Delta P/P_{AVE}$ is equal to or less than 20% where $P_{AVE}$ represents an average of the diffraction peak intensity P in each of the at least one element array in the piezoelectric material of each of the plurality of electromechanical transducer elements and $\Delta P$ represents a maximum difference of the diffraction peak intensity P in each of the at least one element array.

In another aspect of the present disclosure, there is provided an electromechanical-transducing electronic component that includes at least one element array in which a plurality of electromechanical transducer elements are arrayed. Each of the plurality of electromechanical transducer elements includes a first electrode, a piezoelectric material on the first electrode, and a second electrode on the piezoelectric material. Each of the plurality of electromechanical transducer elements is configured to apply a voltage according to a drive signal between the first electrode and the second electrode to deform the piezoelectric material. The piezoelectric material is made of a composite oxide having a perovskite structure preferentially oriented to at least one of a (100) plane and a (001) plane and has a drop of diffraction intensity in a diffraction intensity profile obtained when a tilt angle $\chi$ is changed at a position ($2\theta=\theta$max) of a diffraction peak intensity P where the diffraction intensity is largest in a diffraction intensity peak corresponding to the at least one of the (200) plane and the (002) plane out of diffraction intensity peaks measured by an X-ray diffraction $\theta$-$2\theta$ method. $\Delta P1/P1_{AVE}$ is equal to or less than 20% where $P1_{AVE}$ represents an average of a diffraction peak intensity P1 of $\chi=0°$ in each of the at least one element array in the piezoelectric material of each of the plurality of electromechanical transducer elements and $\Delta P1$ represents a maximum difference of the diffraction peak intensity P1 in each of the at least one element array.

In still another aspect of the present disclosure, there is provided an electromechanical-transducing electronic component that includes at least one element array in which a plurality of electromechanical transducer elements are arrayed. Each of the plurality of electromechanical transducer elements includes a first electrode, a piezoelectric material on the first electrode, and a second electrode on the piezoelectric material. Each of the plurality of electromechanical transducer elements is configured to apply a voltage according to a drive signal between the first electrode and the second electrode to deform the piezoelectric material. The piezoelectric material is made of a composite oxide having a perovskite structure preferentially oriented to at least one of a (100) plane and a (001) plane and has a drop of diffraction intensity in a rocking curve corresponding to at least one of a (200) plane and a (002) plane measured at a position ($2\theta=\theta$1max) of a diffraction peak intensity P1 where the diffraction intensity is largest in a diffraction intensity peak corresponding to the at least one of the (200) plane and the (002) plane out of diffraction intensity peaks measured by an X-ray diffraction $\theta$-$2\theta$ method. A maximum difference $\Delta\theta$1max of the position ($2\theta=\theta$1max) in each of the at least one element array in the piezoelectric material of each of the plurality of electromechanical transducer elements is equal to or less than 0.02°.

In still another aspect of the present disclosure, there is provided a liquid discharge head that includes a plurality of discharge orifices arrayed to discharge liquid, a plurality of liquid chambers communicated with the plurality of discharge orifices, a displacement plate constituting at least one wall of the plurality of liquid chambers, and the electromechanical-transducing electronic component according to any one of the above-described aspects that includes the plurality of electromechanical transducer elements corresponding to the plurality of discharge orifices to displace the displacement plate in accordance with drive signals.

In still another aspect of the present disclosure, there is provided a liquid discharge device that includes the liquid discharge head to discharge liquid from the plurality of discharge orifices according to the drive signals; and at least one external component integrated with the liquid discharge head.

In still another aspect of the present disclosure, there is provided a liquid discharge apparatus that includes the liquid discharge head to discharge the liquid from the plurality of discharge orifices according to the drive signals.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
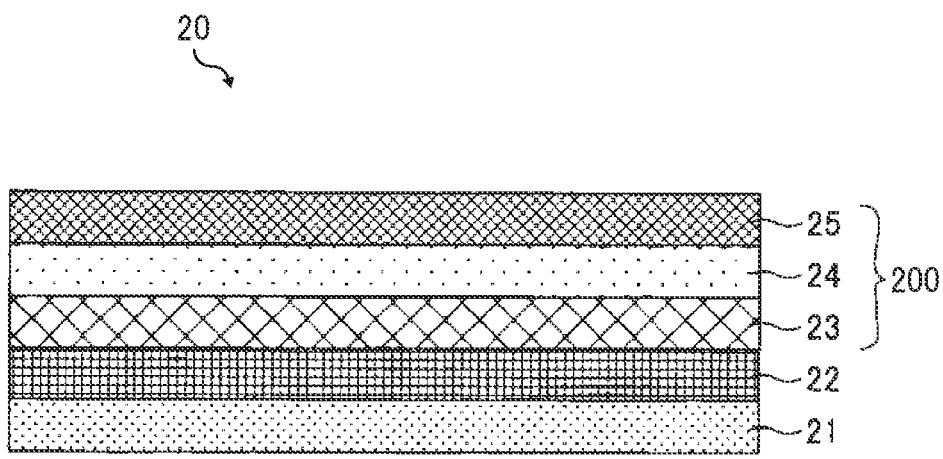
FIG. 1 is a cross-sectional view of an example of a schematic configuration of an electromechanical transducer element according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Below, an electromechanical-transducing electronic component according to an embodiment of the present disclosure is described that is incorporated in a liquid discharge head of an inkjet recording apparatus as a liquid discharge apparatus. Note that embodiments suggested and taught by the present disclosure are not limited to the following exemplary embodiments.

Inkjet recording apparatuses have many advantages, such as extremely noiseless operation, high-speed printing, a high degree of flexibility in ink, i.e., liquid for image formation, and availability of low-cost plain paper. Accordingly, inkjet recording apparatuses are widely used as image forming apparatuses, such as printers, facsimile machines, and copiers.

A liquid discharge head used in such an inkjet recording apparatus includes, for example, one or more nozzle rows. In each nozzle row, a plurality of nozzles as discharge orifices to discharge droplets of liquid (e.g., ink) for image formation are arrayed in row. The liquid discharge head includes, e.g., a plurality of pressurizing liquid chambers communicated with the nozzles, respectively, and a plurality of pressure generators to generate pressure to discharge ink in the plurality of pressurizing liquid chambers. A pressure generator according to the present embodiment is a piezo-type pressure generator including a diaphragm plate and an electromechanical transducer element. The diaphragm plate is a displacement plate (deformable plate) constituting part of a wall surface of a pressurizing liquid chamber, and includes a piezoelectric material to deform the diaphragm. When a predetermined voltage is applied to the electromechanical transducer element, the electromechanical transducer element deforms to displace a surface of the diaphragm plate toward the pressurizing liquid chamber, thus generating pressure in liquid in the pressurizing liquid chamber. The pressure allows liquid (ink droplets) to be discharged from a nozzle communicated with the pressurizing liquid chamber.

The piezoelectric material is a material having piezoelectric properties of being deformed by application of voltage. In the present embodiment, as the piezoelectric material, lead zirconate titanate (PZT: $Pb(Zr_x, Ti_{1-x})O_3$) is used that is a ternary metal oxide having a crystal structure of perovskite. There are a plurality of types of vibration modes on application of a drive voltage to the electromechanical transducer element including the electromechanical transducer film made of PZT (hereinafter, PZT film). Examples of variation modes include a vertical vibration mode (push mode) involving deformation in a film thickness direction with piezoelectric constant d33, a lateral vibration mode (bend mode) involving bending deformation with piezoelectric constant d31, and a shear mode utilizing shearing deformation of film.

For the electromechanical transducer element including the PZT film, as described below, pressurizing liquid chambers and electromechanical transducer elements can be directly built-in a Si substrate by using technologies of semiconductor processing and micro electro mechanical systems (MEMS). Accordingly, the electromechanical transducer elements can be formed as thin-film piezoelectric actuators to generate pressure in the pressurizing liquid chambers.

Figure 2:
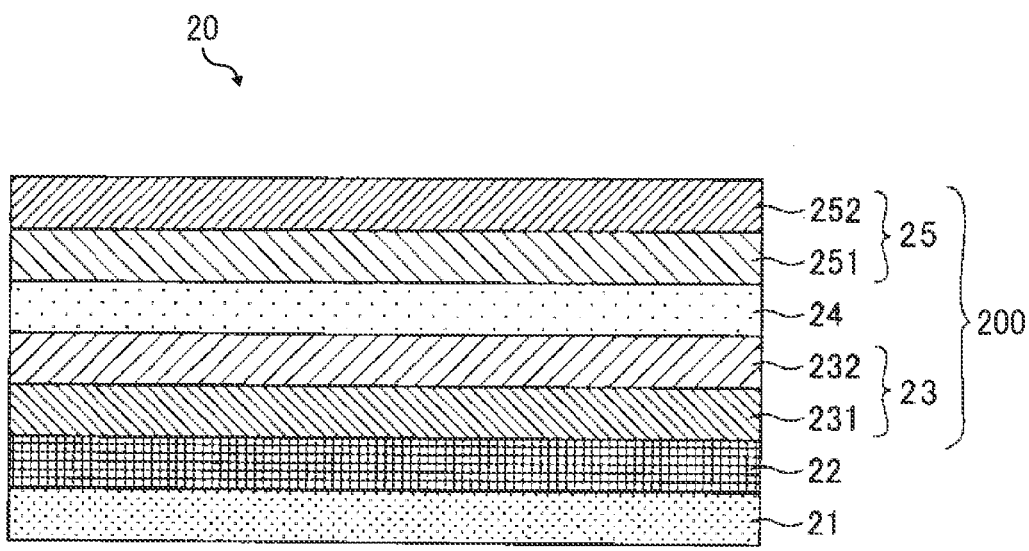
FIG. 2 is a cross-sectional view of another example of a schematic configuration of an electromechanical transducer element according to an embodiment of the present disclosure.

FIGS. 1 and 2 are cross-sectional views of schematic configurations of piezoelectric actuators including electromechanical transducer elements according to embodiments of the present disclosure. In a configuration example of FIG. 1, a piezoelectric actuator 20 includes a substrate 21, a diaphragm 22, and an electromechanical transducer element 200 that are laminated in this order from the bottom thereof. The electromechanical transducer element 200 includes a lower electrode 23, an electromechanical transducer film 24, and an upper electrode 25. The lower electrode 23 as a first electrode is disposed above the substrate 21 with the diaphragm 22 interposed between the lower electrode 23 and the substrate 21. The electromechanical transducer film 24 is disposed on the lower electrode 23. The upper electrode 25 as a second electrode is disposed on the electromechanical transducer film 24.

The lower electrode 23 includes an electrode layer made of, e.g., a metal layer disposed directly under a lower face as a first surface of the electromechanical transducer film 24 or below the lower face of the electromechanical transducer film 24 with an intervening layer, such as a base layer, in between. The upper electrode 25 includes an electrode layer made of, e.g., a metal layer disposed directly on an upper face as a second surface of the electromechanical transducer film 24 or below the upper face of the electromechanical transducer film 24 with an intervening layer, such as a base layer, in between. Applying a voltage between the lower electrode 23 and the upper electrode 25 allows formation of an electric field in a film thickness direction of the electromechanical transducer film 24.

Here, each of the lower electrode 23 and the upper electrode 25 may be, e.g., a combination of a metal layer having a sufficiently small electric resistance and an oxide electrode film having conductivity. For example, in a configuration example of FIG. 2, the lower electrode 23 includes a metal layer 231 and an oxide electrode film 232 laminated on the metal layer 231. The metal layer 231 is disposed at a side closer to the diaphragm 22 and the oxide electrode film 232 is disposed at a side closer to the electromechanical transducer film 24. The upper electrode 25 includes an oxide electrode film 251 and a metal layer 252 laminated on the oxide electrode film 251. The oxide electrode film 251 is disposed at a side closer to the electromechanical transducer film 24. The oxide electrode film 232 and the oxide electrode film 251 are advantageous in suppressing a reduction in the amount of deformation (the amount of surface displacement) of the electromechanical transducer element 200 in continuous driving as the piezoelectric actuator. Each of the oxide electrode film 232 and the oxide electrode film 251 may be a seed layer made of, for example, lead titanate (PT). Such a configuration more reliably suppresses a reduction in the amount of deformation (the amount of displacement of a surface) of the electromechanical transducer element 200.

Figure 3A:
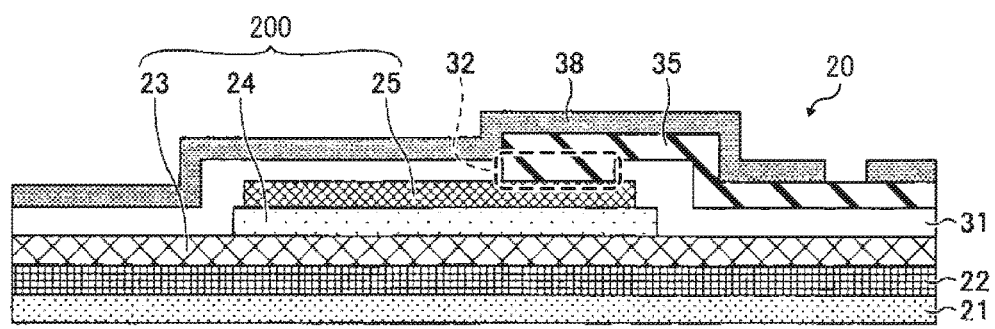
FIG. 3A is a cross-sectional view of an example of a schematic configuration of an electromechanical transducer element of a liquid discharge head according to an embodiment of the present disclosure.
Figure 3B:
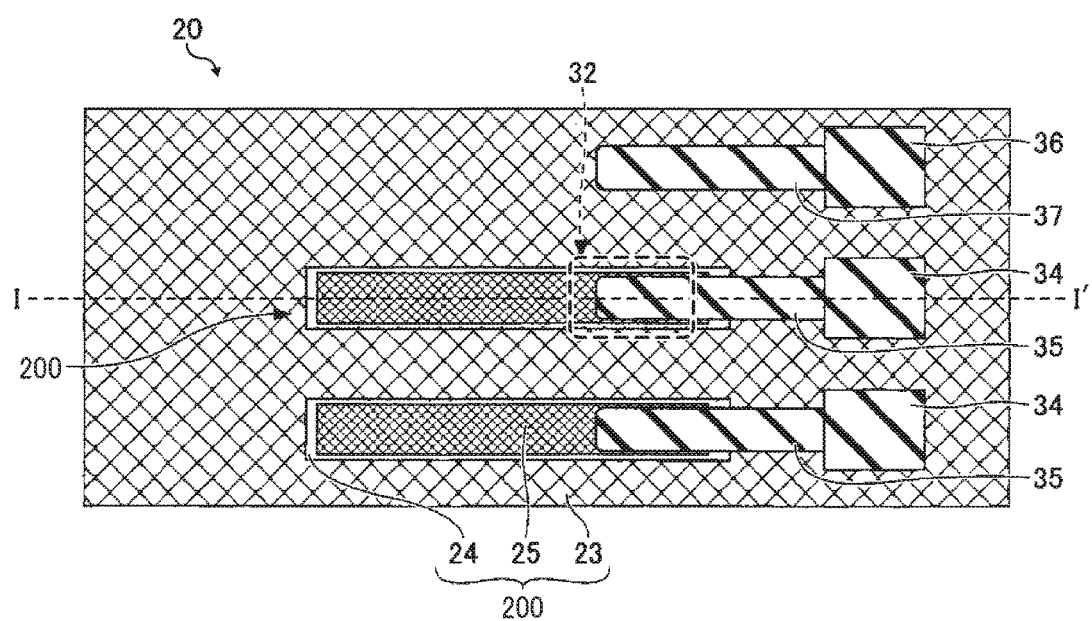
FIG. 3B is a plan view of the electromechanical transducer element of FIG. 3A.

FIGS. 3A and 3B are illustrations of an example of a configuration in which the piezoelectric actuator 20 including the electromechanical transducer element 200 according to an embodiment of the present disclosure is used in, for example, a liquid discharge head. FIG. 3A is a cross-sectional view of a schematic configuration example of the electromechanical transducer element 200 in a liquid discharge head according to an embodiment of the present disclosure. FIG. 3B is a plan view of the electromechanical transducer element 200 of FIG. 3A. Note that, in FIG. 3B, a first insulating protective film (inter-layer insulating film) 31 and a second insulating protective film (inter-layer insulating film) 38 are omitted for ease of understanding of the configuration of the electromechanical transducer element 200. FIG. 3A is a cross-sectional view of the electromechanical transducer element 200 cut along line I-I' of FIG. 3B.

As illustrated in FIG. 3A, the piezoelectric actuator 20 includes the electromechanical transducer element 200. The electromechanical transducer element 200 includes the lower electrode 23, the electromechanical transducer film 24, and the upper electrode 25. As illustrated in FIG. 3B, a plurality of electromechanical transducer elements 200 having such a configuration is arrayed in a predetermined direction along a surface of the substrate 21. The plurality of electromechanical transducer elements 200 is disposed above the substrate 21 with the diaphragm 22 interposed in between.

Any one of the lower electrode 23 and the upper electrode 25 may be configured to be a common electrode shared by the plurality of electromechanical transducer elements 200. In such a configuration, the other of the lower electrode 23 and the upper electrode 25 is configured to be discrete electrodes that are separately disposed corresponding to the respective electromechanical transducer elements 200 and independent from each other. Note that, in the configuration example of FIGS. 3A and 3B, the lower electrode 23 is a common electrode and the upper electrode 25 is configured to be discrete electrodes that are separately disposed corresponding to the respective electromechanical transducer elements 200 and independent from each other.

A first insulating protective film 31 as an inter-layer insulating film is disposed on a predetermined area on the upper electrode 25 and the lower electrode 23. As described below, the first insulating protective film 31 may be made of inorganic compound. At a predetermined position of the first insulating protective film 31, a contact hole 32 is disposed to electrically connect the upper electrode 25 and the lower electrode 23 to other electrodes.

In FIGS. 3A and 3B, each upper electrode 25 as the discrete electrode is connected to a discrete electrode pad 34 to connect an external circuit. The upper electrode (discrete electrode) 25 and the discrete electrode pad 34 are electrically connected with, for example, a connector 35.

In FIGS. 3A and 3B, each lower electrode 23 as the common electrode is connected to a common electrode pad 36 to connect an external circuit. The lower electrode (common electrode) 23 and the common electrode pad 36 may be electrically connected with, for example, an inter-pad connector 37.

A second insulating protective film 38 is disposed on the common electrode pad 36 and the discrete electrode pad 34. As described below, the second insulating protective film 38 may be made of inorganic compound. The second insulating protective film 38 includes an opening portion through which each of the common electrode pad 36 and the discrete electrode pad 34 is partially exposed to the outside.

Figure 4:
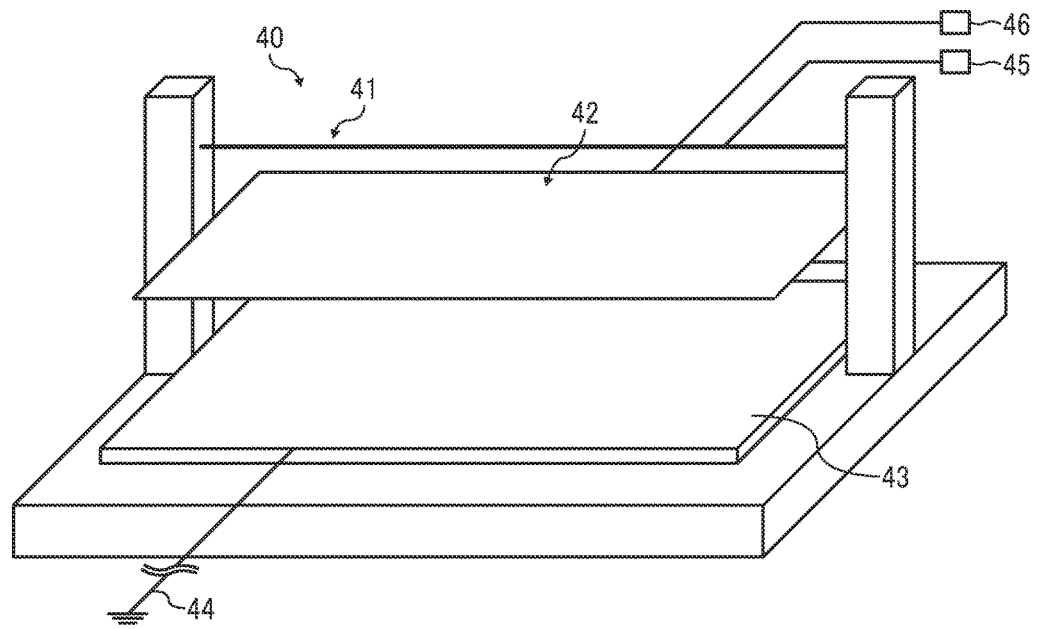
FIG. 4 is a perspective view of a schematic configuration example of a polarization processing device used to perform polarization processing on an electromechanical transducer film in a production process of an electromechanical transducer element, according to an embodiment of the present disclosure.

Next, a description is given of a method of performing polarization processing on an electromechanical transducer film 24 in a production process of the electromechanical transducer element 200 having the above-described configuration. FIG. 4 is a perspective view of a schematic configuration example of a polarization processing device 40 used to perform polarization processing on an electromechanical transducer film in a production process of the electromechanical transducer element, according to an embodiment of the present disclosure. In FIG. 4, the polarization processing device 40 includes a corona electrode 41, a grid electrode 42, and a stage 43 including opposed electrodes. The corona electrode 41 and the grid electrode 42 are connected to a corona electrode power supply 45 and a grid electrode power supply 46, respectively. The corona electrode 41 may have, e.g., a shape of wire. The grid electrode 42 is mesh-processed and configured so that, when a high voltage is applied to the corona electrode 41, ion, electric charge, and so on generated by corona discharge effectively fall onto a sample stage. The stage 43 to set a sample thereon may be connected to a ground wire 44 to facilitate electric charge to flow into a sample (the electromechanical transducer element) being a target of electric discharge. The stage 43 may have a temperature adjustment capability to heat the electromechanical transducer element. In such a case, heating temperatures are not limited to a particular range. However, for example, the stage 43 may be configured to heat the electromechanical transducer element to 350° as a maximum temperature.

The magnitude of the voltage applied to each of the corona electrode 41 and the grid electrode 42 and the distance between the sample and each electrode are not limited in particular. For example, to sufficiently perform polarization processing on the sample, the magnitude of the voltage applied to each of the corona electrode 41 and the grid electrode 42 and the distance between the sample and each electrode may be adjusted in accordance with the sample to adjust the intensity of the corona discharge.

Figure 5:
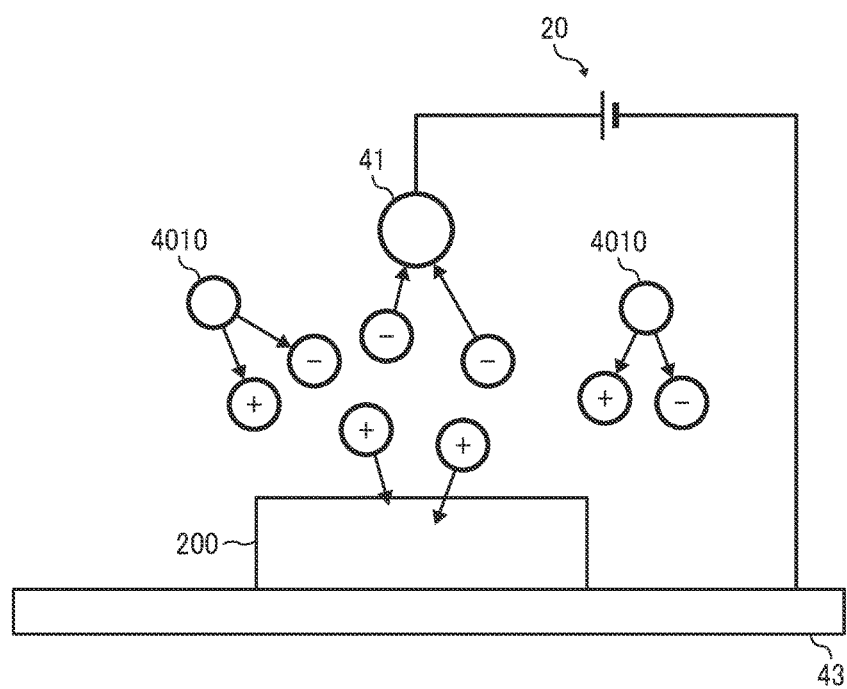
FIG. 5 is an illustration of polarization processing in the polarization processing device of FIG. 4.

FIG. 5 is an illustration of polarization processing in the polarization processing device 40. As illustrated in FIG. 5, if corona discharge is generated with the corona electrode 41 (e.g., corona wire), polarization processing ionizes atmospheric molecules 4010, thus generating positive ions. The positive ions generated flow into an electromechanical transducer film through, for example, a common electrode pad and a discrete electrode pad of the electromechanical transducer element 200, thus causing a stage in which electric charge is accumulated in the electromechanical transducer element 200. Accordingly, an internal potential difference is caused by a difference in charge between the upper electrode and the lower electrode, thus causing polarization processing to be performed.

The amount of charge required for the above-described polarization processing is not limited to any particular amount. However, for example, an amount of charge not less than $1.0 \times 10^{-8}$ [C] may be accumulated in the electromechanical transducer element 200. Alternatively, for example, an amount of charge not less than $4.0 \times 10^{-8}$ [C] may be accumulated in the electromechanical transducer element 200. Accumulating an amount of charge in such a range in the electromechanical transducer element 200 allows polarization processing to be performed to more reliably obtain a polarization rate as described later. If the amount of charge accumulated is less than $1.0 \times 10^{-8}$ [C], a sufficiently property might not be obtained as for the deterioration of displacement after continuous driving of the electromechanical transducer element.

The state of polarization processing of the electromechanical transducer element 200 can be determined from a P-E hysteresis loop of the electromechanical transducer element 200.

Figure 6A:
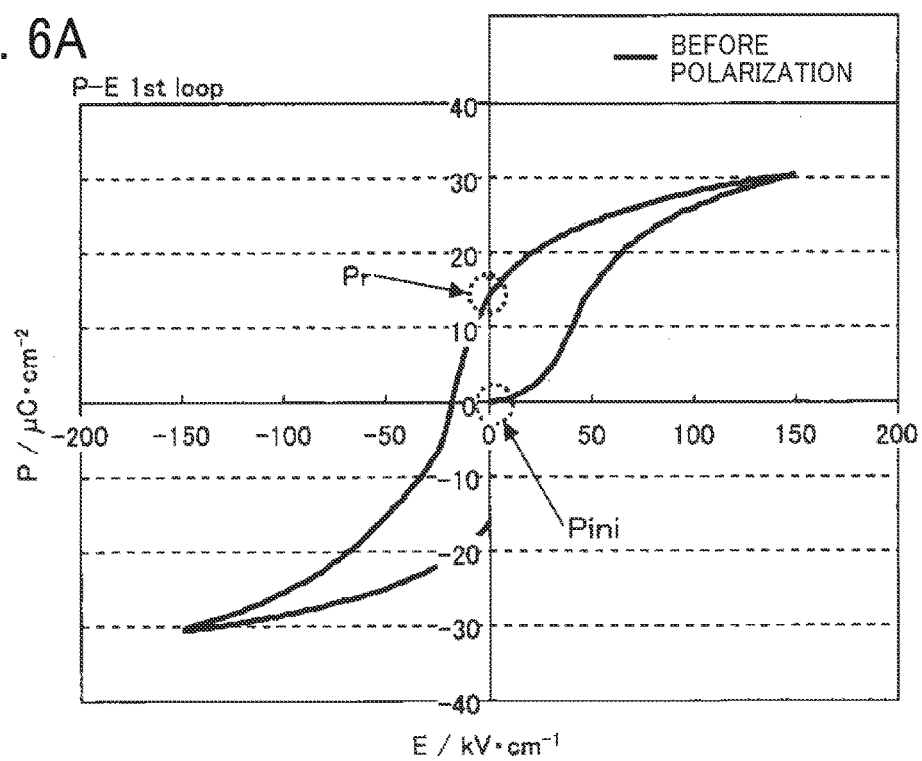
FIG. 6A is a characteristic diagram of an example of a P-E hysteresis loop of the electromechanical transducer element before polarization processing.
Figure 6B:
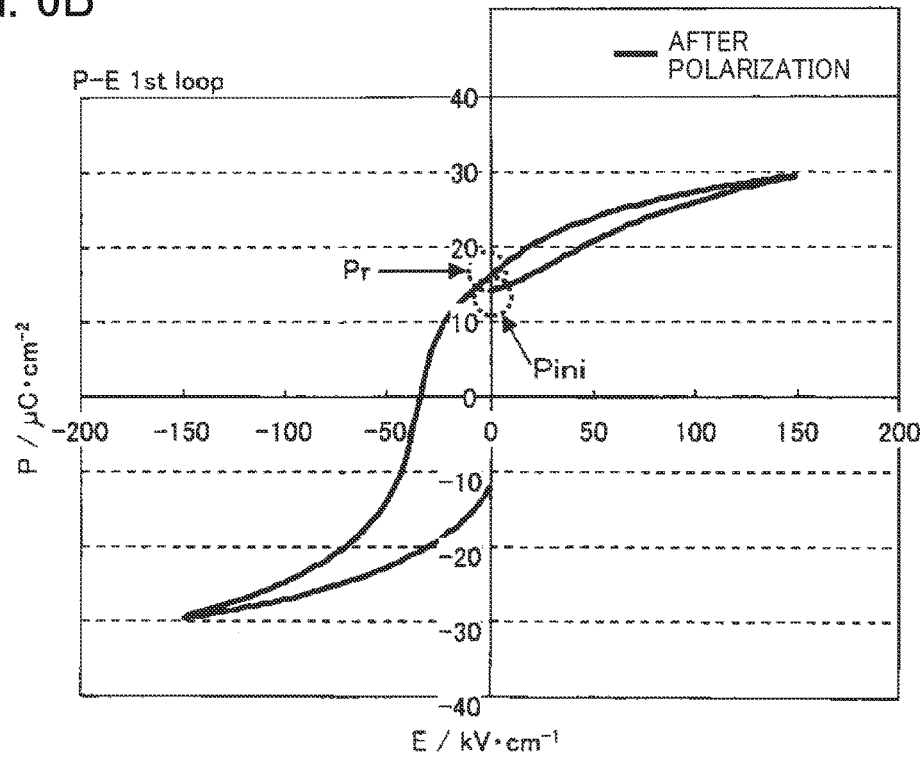
FIG. 6B is a characteristic diagram of an example of a P-E hysteresis loop of the electromechanical transducer element after polarization processing.

FIGS. 6A and 6B are graphs of examples of P-E hysteresis loop to determine the state of polarization processing of the electromechanical transducer element 200. FIG. 6A is a characteristic diagram of an example of P-E hysteresis loop of the electromechanical transducer element 200 before polarization processing is performed. FIG. 6B is a characteristic diagram of an example of P-E hysteresis loop of the electromechanical transducer element 200 after polarization processing is performed.

As illustrated in FIGS. 6A and 6B, when hysteresis loop is measured with an intensity of electric field of ±150 kV/cm applied to the electromechanical transducer element 200 by application of voltage, Pini represents a polarization at 0 kV/cm before application of voltage to the electromechanical transducer element 200. Pr represents a polarization at 0 kV/cm when the intensity of electric field is returned to 0 kV/cm after a voltage of +150 kV/cm is applied to the electromechanical transducer element 200. Here, the value of Pr-Pini is defined as "polarization rate". Based on the polarization rate, it can be determined whether the state of polarization is proper. For example, as illustrated in FIG. 6B, when the value of polarization rate of Pr-Pini measured in the electromechanical transducer element 200 after polarization processing is not greater than a predetermined value, it can be determined that the state of polarization is proper. For example, when the value of polarization rate of Pr-Pini is not greater than 10 $\mu C/cm^2$, it can be determined that the state of polarization is proper. Alternatively, when the value of polarization rate of Pr-Pini is not greater than 5 $\mu C/cm^2$, it can be determined that the state of polarization is proper. When the value of Pr-Pini is not sufficiently small, polarization is not sufficiently performed, thus causing a state in which the amount of deformation (the amount of surface displacement) of the electromechanical transducer element 200 relative to a predetermined drive voltage is unstable. In addition, degradation of the amount of deformation (the amount of surface displacement) of the electromechanical transducer element after continuous driving may not be sufficiently suppressed.

Next, a description is given of an example of components of the electromechanical transducer element 200 according to the present embodiment. As described above, the electromechanical transducer element 200 according to the present embodiment is formed above the substrate 21 with the diaphragm 22 interposed in between. Materials of the substrate 21 are not limited to any particular materials. However, in consideration of ease of processing, availability, and so on, for example, a monocrystalline silicon substrate is preferably used as the substrate 21. There are three types of plane orientation of (100), (110), and (111) for such a monocrystalline silicon substrate. The plane orientation is not limited to any one but a proper substrate is selectable in accordance with the content of processing.

For example, when the substrate 21 is processed by etching, a substrate having a predetermined plane orientation is selectable in accordance with the content of etching. Taking an example of producing a liquid discharge head described later, generally, a substrate is processed by etching to form a pressurizing liquid chamber. In such a case, as a method of etching, typically, anisotropic etching is employed. Anisotropic etching utilizes properties in which the etching rage is different between plane orientations of a crystal structure. For example, in the anisotropic etching in which the substrate is immersed in an alkaline solution, such as KOH, the etching rate of a (111) plane is about 1/400 of the etching rate of a (100) plane. Therefore, a structure having an inclination of about 54° can be produced in the plane orientation (100). On the other hand, a deep groove can be formed in the plane orientation (110), thus an array density to be increased while rigidity is maintained. Accordingly, for example, for a substrate constituting a liquid discharge head, a monocrystalline silicon substrate having a (110) plane orientation is preferably used.

The thickness of the substrate 21 is selectable in accordance with usage and so on and is not limited to any particular range. However, for example, the thickness of the substrate 21 may be 100 $\mu m$ to 600 $\mu m$.

When the diaphragm 22 constitutes the liquid discharge head described later, the diaphragm 22 as a base film receives a force generated by the electromechanical transducer element 200 and deforms (the surface of the diaphragm 22 deforms) to discharge droplets of ink from a pressure chamber. Accordingly, the base film may have a predetermined strength. As the materials of the diaphragm 22, for example, Si, $SiO_2$, and $Si_3N_4$ are prepared according to a chemical vapor deposition (CVD) method. Further, a material may be selected having a linear expansion coefficient close to a linear expansion coefficient of at least one of the lower electrode 23 and the electromechanical transducer film 24 illustrated in FIG. 1. As a material of the electromechanical transducer film 24, in which PZT is typically used, the diaphragm 22 may be made of a material having a linear expansion coefficient of from $5 \times 10^{-6}$ to $10 \times 10^{-6}$ [1/K] close to a linear expansion coefficient of $8 \times 10^{-6}$ [1/K]. Alternatively, for example, the diaphragm 22 may be made of a material having a linear expansion coefficient of from $7 \times 10^{-6}$ to $9 \times 10^{-6}$ [1/K].

Examples of the materials of the diaphragm 22 include aluminum oxide, zirconium oxide, iridium oxide, ruthenium oxide, tantalum oxide, hafnium oxide, osmium oxide, rhenium oxide, rhodium oxide, palladium oxide, and compounds of the foregoing materials. Using such materials, the diaphragm 22 can be produced by a spin coater using a sputtering method or a sol-gel method. The film thickness of the diaphragm 22 is preferably in a range of not less than 1 $\mu m$ and not greater than 3 $\mu m$ and is more preferably in a range of not less than 1.5 $\mu m$ and not greater than 2.5 $\mu m$. If the film thickness of the diaphragm 22 is less than 1 $\mu m$, a pressurizing liquid chamber 80 may not be easily processed. If the film thickness of the diaphragm 22 is greater than 3 $\mu m$, the base may be less deformed and displaced, thus hampering stable discharge of ink droplets.

If the film thickness of the diaphragm 22 varies among the nozzles 81, the amount of displacement of the diaphragm 22 also varies among nozzles 81, thus causing variation in the amount of liquid discharged from the nozzles 81. In particular, if a variation in the film thickness of the diaphragm 22 among the nozzles 81 in nozzle row causes variation in the amount of liquid discharged from each of the nozzles 81 in nozzle row, for example, the image quality of the inkjet recording apparatus would be adversely affected. Therefore, regarding the film thickness of the diaphragm 22, $\Delta ds/ds_{AVE}$ is preferably not greater than 5%, where $ds_{AVE}$ represents an average of the film thickness of the diaphragm 22 in nozzle row and $\Delta ds$ represents a maximum difference in the film thickness of the diaphragm 22 in nozzle row.

Note that, depending on the production process, the film thickness of the diaphragm 22 in nozzle row may vary so that the film thickness lineally increases or decreases along a nozzle array direction in which the nozzles 81 are arranged in row. For example, when a plurality of piezoelectric actuator chips (electromechanical-transducing electronic components) are produced from a single Si wafer, the film thickness of the diaphragm 22 is likely to vary so that the film thickness linearly increases or decreases in the nozzle array direction in the piezoelectric actuator chips manufactured in an area near an outer peripheral portion of the wafer. When such a variation arises, $\Delta ds'/ds_{AVE}$ is preferably not greater than ±5%, where $\Delta ds'$ represents the rate of change (inclination) in the film thickness of the diaphragm 22 in the nozzle array direction.

The lower electrode 23 and the upper electrode 25 are not limited to any particular materials but any proper materials are selectable. For example, the lower electrode 23 and the upper electrode 25 may be made of a metal film and an oxide electrode film, or in particular, may be made of a laminate of a metal film and an oxide electrode film. As illustrated in FIG. 2, the lower electrode 23 and the upper electrode 25 may include the metal layer 231 and the metal layer 252, respectively, of sufficiently small electric resistances. Examples of a metal material of the metal layer 231 and the metal layer 252 include platinum having high heat-resistance and low reactivity. However, platinum may not have a sufficient barrier property against lead. Accordingly, platinum group elements, such as iridium and platinum-rhodium, or alloy films thereof may be used for the metal layer 231 and the metal layer 252. When platinum is used, adhesion of platinum with a base (in particular, $SiO_2$) is poor. Therefore, for example, Ti, $TiO_2$, Ta, $Ta_2O_5$, or $Ta_3N_5$ is preferably laminated in advance as an intervening layer. Examples of a method of producing the metal electrode film include a sputtering method and a vacuum vapor deposition method. The film thickness may be set in a range of from 0.05 μm to 1 μm or a range of from 0.1 μm to 0.5 μm.

As illustrated in FIG. 2, the lower electrode 23 and the upper electrode 25, respectively, may include the oxide electrode film 232 and the oxide electrode film 251 each having conductivity at an interface with the electromechanical transducer film 24. Examples of a material of the oxide electrode film 232 and the oxide electrode film 251 include $SrRuO_3$ and $LaNiO_3$. The method of film formation of the oxide electrode film 232 and the oxide electrode film 251 is not limited to any particular method. For example, the oxide electrode film 232 and the oxide electrode film 251 may be formed by a sputtering method.

The oxide electrode film 232 constituting the lower electrode 23 affects the control of orientation of the electromechanical transducer film 24 (the PZT film). Accordingly, materials to be selected are different in accordance with the preferential orientation. In the present embodiment, since the plane orientation of the PZT film to be preferentially oriented is (100) plane, the PZT film may be formed after a seed layer made of $LaNiO_3$, $TiO_2$, or $PbTiO_3$ as the oxide electrode film 232 is formed on the metal layer 231.

An example of a material of the oxide electrode film 251 constituting the upper electrode 25 is SRO. The film thickness of the oxide electrode film 251 is preferably in a range of from 20 nm to 80 nm, and more preferably in a range of from 30 nm to 50 nm. If the film thickness is smaller than such a range, a sufficient characteristic is not obtained in the initial amount of deformation (the amount of surface displacement) or the deterioration characteristic of the amount of deformation (the amount of surface displacement). By contrast, if the film thickness is larger than such a range, a dielectric strength voltage of the subsequently formed PZT film is very low and leakage might occur easily.

An example of a material of the electromechanical transducer film 24 (piezoelectric film) is an oxide including Pb (for example, PZT). Hereinafter, the electromechanical transducer film made of PZT may be referred to as "PZT film". The PZT is a solid solution of lead zirconate ($PbZrO_3$) and titanium acid ($PbTiO_3$) and has different characteristics according to a ratio of the lead zirconate ($PbZrO_3$) and the titanium acid ($PbTiO_3$) in the solution. In a composition exhibiting generally superior piezoelectric properties, a ratio of $PbZrO_3$ and $PbTiO_3$ is 53:47. If the composition is represented by a chemical formula, the composition is represented by $Pb(Zr_{0.53}Ti_{0.47})O_3$, generally, PZT (53/47).

Another example of a material of the electromechanical transducer film 24 is barium titanate as a composite oxide other than the PZT. In such a case, barium alkoxide and titanium alkoxide compounds are used as a starting material and are dissolved in a common solvent, to prepare a barium titanate precursor solution.

In the present embodiment, an example is described in which the electromechanical transducer film 24 is made of PZT and the (100) plane of PZT is preferentially oriented. In such a case, the composition ratio of Zr and Ti, that is, Ti/(Zr+Ti) may be set in a range of not less than 0.45 (45%) and not greater than 0.55 (55%) or in a range of not less than 0.48 (48%) and not greater than 0.52 (52%).

The method of producing the electromechanical transducer film 24 is not limited to any particular method. For example, the electromechanical transducer film 24 may be produced by a spin coater using, for example, a sputtering method or a sol-gel method In any case, patterning is performed by, for example, photolithoetching to obtain a desired pattern.

When the sol-gel method is used, the electromechanical transducer film (the PZT film) 24 is produced according to, for example, the following procedure. For example, lead acetate, zirconium alkoxide, and titanium alkoxide compound are used as starting materials and are dissolved in methoxyethanol as a common solvent to obtain a uniform solution. Thus, a PZT precursor solution can be prepared. Since a metal alkoxide compound is easily hydrolyzed by atmospheric moisture, a stabilizer, such as acetylacetone, acetic acid, or diethanolamine may be appropriately added to the PZT precursor solution.

When the PZT film is formed on an entire surface of the base substrate in which, e.g., the lower electrode is formed, the PZT film is obtained by forming a coating by a solution coating method, such as a spin coating method, and performing each heat treatment of solvent drying, thermal decomposition, and crystallization on the coating. When the coated film is transformed to the crystallized film, the volume of the film contracts. To obtain a crack-free film, the concentration of the precursor solution is preferably adjusted to obtain a film thickness not greater than 100 nm in one-time process.

Alternatively, in the production according to an inkjet method, a patterned film can be obtained by a production flow similar to a production flow of the oxide electrode film 232. A surface modifier is selected in accordance with a material of the metal layer 231 as a base of the surface modifier. When an oxide is used as the base of the surface modifier, mainly a silane compound is selected as the surface modifier. When a metal is used as the base, mainly alkanethiol is selected.

The film thickness of the electromechanical transducer film 24 is not limited to a particular thickness but is selectable in accordance with the amount of deformation (the amount of surface displacement). For example, the film thickness may be in a range of from 0.5 μm to 5 μm or in a range of from 1 μm to 2 μm. A film thickness in such a range generates a sufficient amount of deformation (the amount of surface displacement). With a film thickness in such a range, the number of steps for laminating layers to form the electromechanical transducer film 24 does not unnecessarily increase, thus allows production with good productivity.

The first insulating protective film 31, the second insulating protective film 38, the connector 35, and the connector 37 are produced, for example, as follows.

The first insulating protective film 31 may be made of a material that is impermeable to moistures in the atmosphere and prevents damage to the electromechanical transducer element 200 in the steps of film formation and etching. Accordingly, for example, dense inorganic material (inorganic compound) may be used. As the first insulating protective film 31, an oxide, nitride, or carbonized film may be used to obtain a high degree of protection performance with a thin film. The first insulating protective film 31 may be made of a material highly adhesive to a material of a base (a material of the upper electrode 25, the lower electrode 23, or the electromechanical transducer film 24 or a material of an upper surface of the substrate 21) contacting the first insulating protective film 31. Examples of such a material include an oxide film used for ceramic materials, such as $Al_2O_3$, $ZrO_2$, $Y_2O_3$, $Ta_2O_3$, and $TiO_2$ are exemplified.

The method of film formation of the first insulating protective film 31 is not limited to any particular method. For example, as the method, a method of film formation that does not damage the electromechanical transducer element 200 is selected. For example, a vapor deposition method or an atomic layer deposition (ALD) method may be used. In particular, film formation may be performed according to the ALD method that is advantageous in that the number of selectable materials is greater. In particular, according to the ALD method, a thin film with quite high film density is produced, thus reducing damage to the electromechanical transducer element in the production steps.

The film thickness of the first insulating protective film 31 is not limited to any particular thickness. However, the first insulating protective film 31 has a thickness that is large enough to obtain a protection performance of the electromechanical transducer element and is small enough not to hamper the displacement of the electromechanical transducer element. For example, the film thickness of the first insulating protective film 31 may be in a range of not less than 20 nm and not greater than 100 nm. A film thickness greater than 100 nm may hamper the displacement of the electromechanical transducer element 200. By contrast, a film thickness smaller than 20 nm may not provide a sufficient performance as the protective layer of the electromechanical transducer element 200 and the performance of the electromechanical transducer element 200 may decrease.

The first insulating protective film 31 may be constituted of a plurality of layers. For example, when the first insulating protective film 31 is constituted of two layers, to construct the second layer of the insulating protective film relatively thicker, an opening may be formed near the upper electrode in the second layer of the insulating protective film so as not to significantly hamper the vibration displacement of the electromechanical transducer element. As the second layer of the insulating protective film, any oxide, nitride, and carbide or a composite compound thereof can be used. For example, $SiO_2$, which is typically used in a semiconductor device, may be used. The film formation may be any suitable method. For example, the CVD method or sputtering method may be used for film formation. In particular, if the step coating of a pattern forming part, such as an electrode forming part, is considered, the CVD method capable of isotropically forming a film may be used. The film thickness of the second layer of the insulating protective film is not limited to any particular film thickness. In consideration of the voltage applied to each electrode, a film thickness not dielectrically broken down is selectable. For example, the electric field intensity applied to the insulating protective film is set in a range in which the insulating protective film is not dielectrically broken down. In consideration of the surface properties or pin holes of the base of the insulating protective film, the film thickness may be not less than 200 nm or may be not less than 500 nm.

Materials of the connector 35 and the connector 37 are not limited to any particular materials but various types of conductive materials are usable. For example, each of the connector 35 and the connector 37 may be made of any metal electrode material selected from Cu, Al, Au, Pt, Ir, Ag alloy, and Al alloy. The method of producing the connector 35 and the connector 37 is not limited to any particular method but any particular method can be used. The connector 35 and the connector 37 are produced by, for example, the sputtering method or the spin coating method and a desired pattern is obtained by, for example, photolithographic etching. The film thickness of each of the connector 35 and the connector 37 is not limited to any particular thickness but may be, for example, in a range of not less than 0.1 μm and not greater than 20 μm or in a range of not less than 0.2 μm and not greater than 10 μm. If the film thickness is smaller than a film thickness in such a range, resistance increases and may hamper a sufficient current from flowing to the electrode. If the film thickness is greater than a film thickness in such a range, it takes a longer time in the production process and may reduce the productivity.

When the first insulating protective film 31 is provided, a contact hole portion for the connector 35 and the connector 37 is disposed in the first insulating protective film 31 so that the connector 35 and the connector 37 are connected to the common electrode and the discrete electrode. The dimension of the contact hole portion is not limited to any particular size but may be, for example, 10 μm×10 μm. As the contact resistance of the contact hole portion, the common electrode may have a contact resistance of, for example, not greater than 10Ω and the discrete electrode may have a contact resistance of, for example, not greater than 1Ω. Such a range allows stable supply of a sufficient current to each electrode. Alternatively, the common electrode may have a contact resistance of not greater than 5Ω and the discrete electrode may have a contact resistance of not greater than 0.5Ω. With a contact resistance greater than such a range, when the electromechanical transducer element 200 is used in the liquid discharge head (see FIG. 11), a sufficient electric current may not be supplied and may cause a failure in discharging liquid.

The second insulating protective film 38 is a passivation layer having a function of protecting the connector 35 and the connector 37. The second insulating protective film 38 covers the connector 35 and the connector 37, except for areas of the discrete electrode pad 34 and the common electrode pad 36. Even when low cost Al or an alloy material including Al as main ingredient is used for the connector 35 and the connector 37, such a configuration enhances the reliability of the electromechanical transducer element 200. In addition, since low cost materials are used for the connector 35 and the connector 37, the cost of the electromechanical transducer element 200 is reduced.

The material of the second insulating protective film 38 is not limited to any particular material but any inorganic material or any organic material can be used. For example, a material with low moisture permeability may be used. Examples of inorganic material include oxide, nitride, and carbide. Examples of organic material include polyimide, acrylic resin, and urethane resin. However, for organic material, to function as the insulating protective film, the film thickness may be relatively thick and patterning may not be easily performed. Accordingly, an inorganic material may be used that can show a function of protecting wiring in a thin film. When Al wiring is used as the connector 35 and the connector 37, for example, $Si_3N_4$, which is widely used in semiconductor devices, may be used as the second insulating protective film.

The film thickness of the second insulating protective film 38 may be, for example, not less than 200 nm or not less than 500 nm. If the film thickness is smaller than such a range, a sufficient passivation performance is not obtained. For example, breaking due to corrosion of the connector may cause a reduction in reliability.

The second insulating protective film 38 may have openings above the electromechanical transducer elements 200. When the electromechanical transducer element 200 is applied to the liquid discharge head, the second insulating protective film 38 may have openings above the diaphragm.

Such a configuration allows the electromechanical transducer element to be more efficient and have higher reliability.

The second insulating protective film 38 may have openings to expose the common electrode pad 36 and the discrete electrode pad 34. The openings are formed by, for example, a photolithography method or dry etching.

The area of each of the common electrode pad 36 and the discrete electrode pad 34 is not limited to any particular size. When polarization processing is performed after formation of the common electrode pad 36, the discrete electrode pad 34, and the second insulating protective film 38, electric charge is supplied from each of the common electrode pad 36 and the discrete electrode pad 34. Therefore, for example, the area of each of the common electrode pad 36 and the discrete electrode pad 34 may be set to such a size that polarization processing is fully performed. For example, each of the common electrode pad 36 and the discrete electrode pad 34 may have not less than a size of 50 μm×50 μm or may have not less than a size of 100 μm×300 μm. If the area of the common electrode pad 36 and the discrete electrode pad 34 is smaller than the above-described range, polarization processing may not be sufficiently performed and the degree of degradation of the amount of deformation (the amount of surface displacement) may increase over time after continuous driving.

Next, a description is given of a relationship between crystal orientation of the electromechanical transducer film (PZT film) 24 and properties as the electromechanical transducer element 200 in the present embodiment. In the present embodiment, the electromechanical transducer film 24 was formed at a thickness of 2 μm by spin coating using the PZT precursor solution prepared by the sol-gel method, and then the electromechanical transducer film 24 was evaluated by an X-ray diffraction device. As a result, it was confirmed that the electromechanical transducer film 24 was quite preferentially oriented in the (100) plane. Note that the electromechanical transducer film 24 preferably has degrees of orientation $\rho_{100}$ and $\rho_{011}$ of 85% or more on at least one of the (100) plane and the (001) plane obtained by Equation (1) described below and has a degree of orientation $\rho_{110}$ of 5% or less on the (110) plane. At least one of the degrees of orientation $\rho_{100}$ and $\rho_{110}$ on the (100) plane and the (001) plane is preferably equal to or greater than 95%, more preferably equal to or greater than 99%. When the degree of orientation is less than 85%, no sufficient properties in displacement deterioration after continuous driving can be obtained.

$\rho = I(hkl)/\Sigma I(hkl)$ . . . (1) Equation (1) is intended to calculate the ratio of each of orientations on the (100) plane, (010) plane, (001) plane, (011) plane, (101) plane, (110) plane, and (111) plane obtained by X-ray diffraction with respect to the sum total of peak intensities in all the foregoing orientations as 1, and represents the average degree of orientation for each of the orientations. The denominator on the right side of Equation (1) refers to the sum total of the peak intensities in each of orientations, and the numerator of on the right side of Equation (1) refers to the peak intensity of the orientation to be calculated.

The at least one of the (100) plane and the (001) plane is described here because the 2θ values of the peak intensities measured by X-ray diffraction (XRD) on the (100) plane and the (001) plane are close to each other and observed as overlapping peaks, and thus are difficult to recognize separately. In addition, the PZT itself is characteristically considered as a pseudo tetragonal system, and the (100) plane and/or the (001) plane do not need to be separately recognized.

There is a θ-2θ method as a frequently used method for measurement with X-ray diffraction. According to the θ-2θ method, an X ray is entered at an angle of θ into a substrate surface of a sample to be measured, and out of X rays reflected from the sample, the X ray at an angle of 2θ with respect to the direction of X-ray incidence is detected, and changes in the diffraction intensity with changes in θ are checked. At X-ray diffraction, the diffraction intensity is high when Bragg's condition (2d sin θ=nλ (λ: wavelength of X ray, d: clearance between crystal faces, n: integer)) is satisfied. At that time, there is a correlation between the clearance between crystal planes (lattice constant) and 2θ. Therefore, based on the values of 2θ with high diffraction intensities, the crystal structure of the sample into which the X ray is entered can be recognized.

Figure 7:
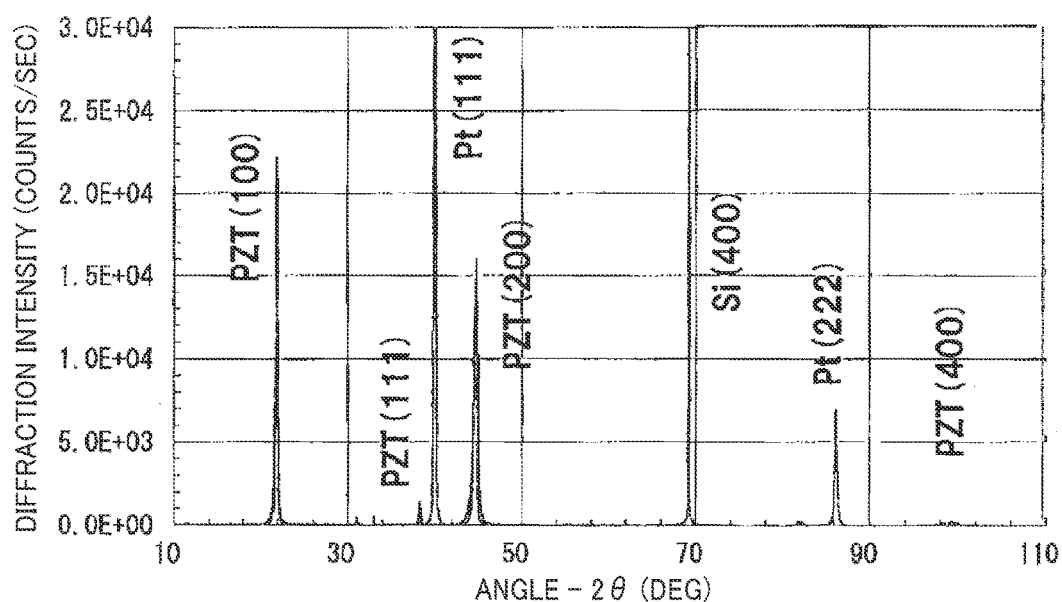
FIG. 7 is a graph of an example of measurement results of 2θ values obtained by an X-ray diffraction θ-2θ method on the electromechanical transducer film (PZT film) according to an embodiment of the present disclosure.

FIG. 7 is a graph of an example of measurement results of 2θ values obtained by the X-ray diffraction θ-2θ method on the electromechanical transducer film 24 according to the present embodiment. Note that the θ-2θ method is used to determine how the clearance between crystal planes is distributed in the direction of film thickness at a certain point on the substrate surface of the film to be measured. Therefore, according to the θ-2θ method, it is not possible to determine how the clearance between crystal planes is distributed in the direction of film thickness at a point slightly shifted from the certain point on the substrate surface in the plane direction of the substrate surface.

As a method for determining the distribution, a rocking curve method is known. According to the rocking curve method, the incident angle of an X ray and the angle (2θ) of a detector are fixed at a position where the diffraction intensity measured by the θ-2θ method is largest, and the diffraction intensity is measured only with slight changes around θ in the angle (ω) formed by the substrate surface of the sample and the incident X ray. According to the rocking curve method, the incident angle of an X ray and the angle (2θ) of a detector are fixed at a position where the diffraction intensity measured by the θ-2θ method is largest, and the diffraction intensity is measured only by slightly changing the tilt angle (χ) of the substrate surface of the sample.

Figure 8:
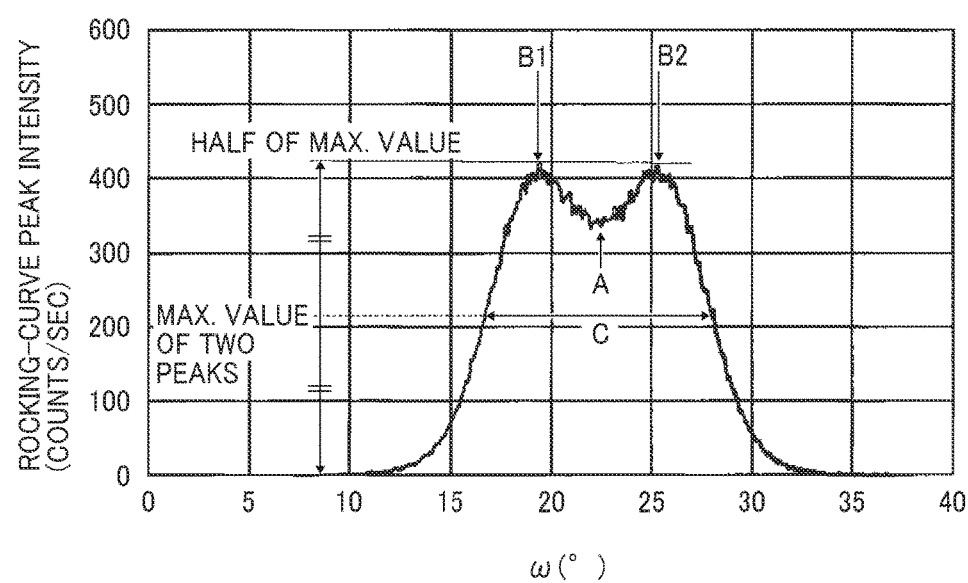
FIG. 8 is a graph of a rocking curve corresponding to at least one of a (200) plane and a (002) plane measured at a position (2θ) where the diffraction intensity is largest in a diffraction intensity peak corresponding to the (200) plane out of peaks of diffraction intensity measured by the X-ray diffraction θ-2θ method on the electromechanical transducer film (PZT film) of FIG. 7.

FIG. 8 is a graph of a rocking curve corresponding to at least one of a (200) plane and a (002) plane measured at a position (2θ) where the diffraction intensity is largest at a peak of diffraction intensity corresponding to the (200) plane out of the peaks of diffraction intensity measured by a X-ray diffraction θ-2θ method on the electromechanical transducer film 24. The 2θ value is 46.229° at the peak position on the (200) plane of the electromechanical transducer film 24 in the present embodiment as illustrated in FIG. 7. The rocking curve illustrated in FIG. 8 was obtained by measuring the diffraction intensities only with slight changes in the angle (ω) formed by the substrate surface of the sample and the incident X ray at the peak position of 46.229°. Hereinafter, the simple term "rocking curve" means the thus obtained rocking curve.

As illustrated in FIG. 8, the electromechanical transducer film 24 according to the present embodiment has a drop A in the diffraction intensity and two peaks B1 and B2 on the both sides of the drop A in the rocking curve. In addition, full width at half maximum (FWHM) C of the rocking curve, that is, the width between points corresponding to the half value of the largest peak intensity in the rocking curve is 11.3°.

The electromechanical transducer film 24 is formed on the lower electrode 23 by growing crystal from a seed layer as a crystal nucleus on the lower electrode 23. It has been conventionally considered that the growth directions of crystal are preferably aligned to increase the amount of displacement obtained by piezoelectric effect. As the growth directions of crystal are more aligned, the shape of the rocking curve becomes sharper with a narrow full width at half maximum centered on one peak corresponding to the growth direction. Therefore, a PZT film has been conventionally produced with a narrower full width at half maximum of a rocking curve having one peak. However, the amount of displacement obtained according to the conventional concept is limited, and an electromechanical transducer element offering a larger amount of displacement has been desired.

Hence, through diligent studies, the inventor has found that, when the electromechanical transducer film 24 has a drop A in diffraction intensity in a rocking curve corresponding to at least one of a (200) plane and a (002) plane measured at a position ($2\theta$) where the diffraction intensity is largest at a peak of diffraction intensity corresponding to at least one of the (200) plane and the (002) plane out of peaks of diffraction intensity measured by an X-ray diffraction $\theta$-$2\theta$ method, the electromechanical transducer film 24 would be capable of producing a larger amount of displacement than a conventional PZT film with one peak in a rocking curve. The presence of the drop A in the rocking curve means that there are at least two peaks B1 and B2 with the drop between the two peaks. That is, it is considered that the growth directions of crystal in the electromechanical transducer film 24 are not aligned in one direction but are aligned in two separate directions corresponding to the two peaks. When the crystal in the PZT film is divided into two or more kinds of crystal portions different in growth direction as described above, there arises interference between the crystal portions different in growth direction of crystal, along directions perpendicular to the growth directions of crystal. It is considered that the stress occurring on the interfering portions advantageously acts on the deformation of the electromechanical transducer film 24, thereby leading to an increased displacement amount of the diaphragm 22. In the conventional PZT film, the growth directions of crystal are aligned in one direction and thus such interfering portions are few in number, and the displacement plate is displaced without using the stress produced on the interfering portions. Therefore, according to the present aspect, it is possible to achieve a large amount of displacement that could not have been achieved by the conventional PZT film.

Figure 9:
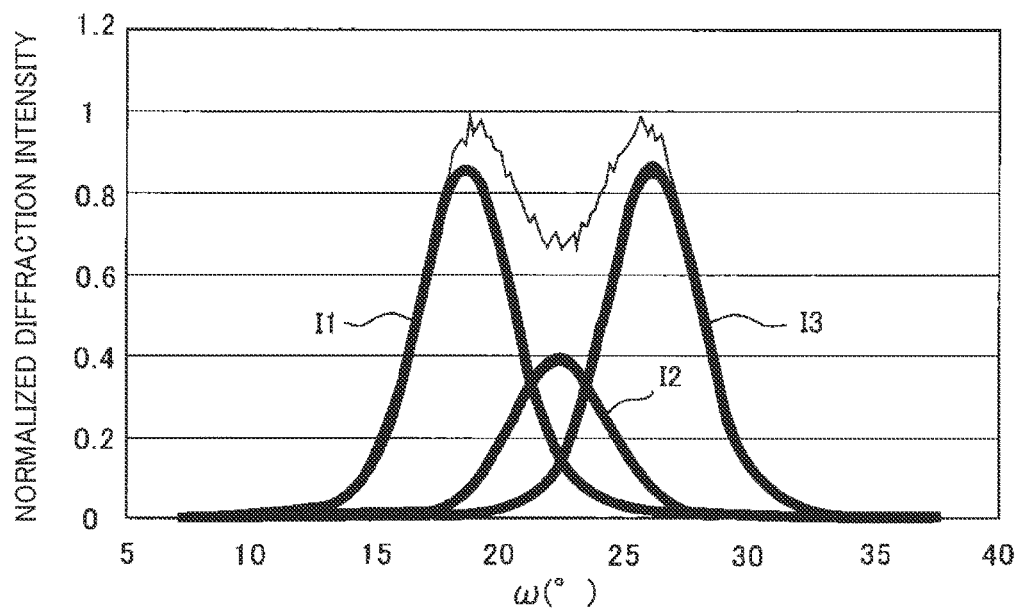
FIG. 9 is an illustration of the rocking curve illustrated in FIG. 8 with three rocking curve components separated by peak separation.

FIG. 9 is an illustration of the rocking curve illustrated in FIG. 8 with three rocking curve components separated by peak separation. The rocking curve illustrated in FIG. 8 can be separated into three rocking curve components I1, I2, and I3 illustrated in FIG. 9. Note that, in FIG. 9, the diffraction intensity of each of the rocking curve components I1, I2, and I3 is normalized based on the maximum intensity of the rocking curve illustrated in FIG. 8. Of the rocking curve components I1, I2, and I3, the second rocking curve component I2 corresponds to a crystal portion having a crystal orientation vertical to the surface of the substrate 21. Of the rocking curve components I1, I2, and I3, each of the first rocking curve component I1 and the third rocking curve component I3 corresponds to a crystal portion having a crystal orientation inclined relative to the surface of the substrate 21.

Figure 10:
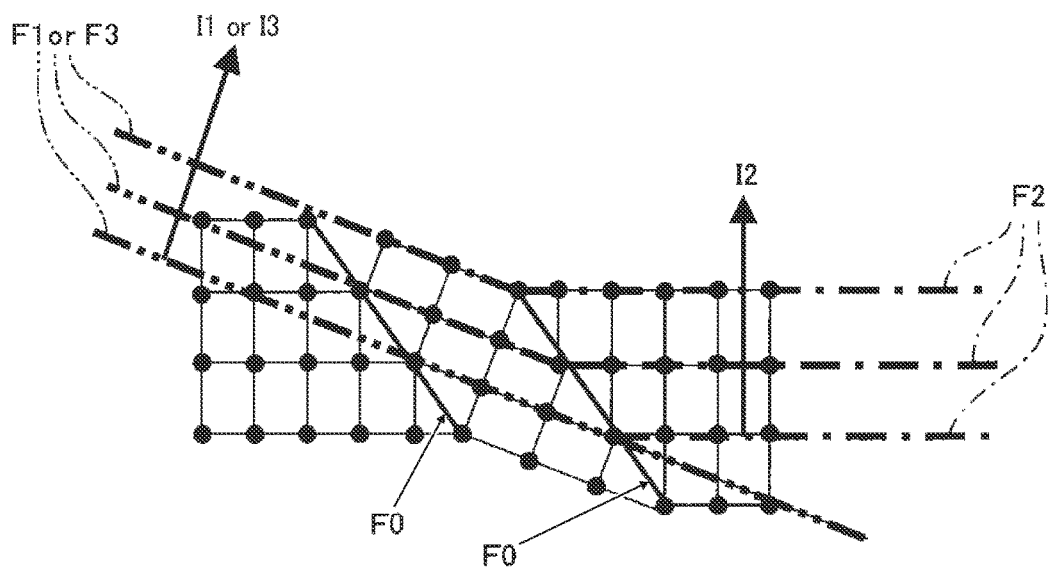
FIG. 10 is an illustration of a crystal structure of the electromechanical transducer film (PZT film)

FIG. 10 is a schematic illustration a crystal structure of the electromechanical transducer film 24. The electromechanical transducer film 24 according to the present embodiment has a twin plane at the boundary of the crystal portion corresponding to the second rocking curve component I2 and the crystal portion corresponding to the first rocking curve component I1 or the third rocking curve component I3. As seen from the three rocking curve components separated into three peaks illustrated in FIG. 9, the percentage of the crystal portions (corresponding to the first rocking curve component I1 and the third rocking curve component I3) having a crystal orientation in a direction inclined relative to the surface of the substrate 21 is greater in the electromechanical transducer film 24 according to the present embodiment than in a PZT film having one peak in a rocking curve. Therefore, it is considered that the electromechanical transducer film 24 according to the present embodiment have more twin planes than a PZT film having one peak in a rocking curve. It is considered that the stress occurring on the twin planes advantageously acts on the deformation of the electromechanical transducer film 24, thereby leading to an increased displacement amount of the diaphragm 22.

Note that, as the percentage of the crystal portions corresponding to the first rocking curve component I1 and the third rocking curve component I3 is greater than the crystal portion corresponding to the second rocking curve component I2 or as the crystal orientation of the crystal portion corresponding to each of the first rocking curve component I1 and the third rocking curve component I3 is more inclined relative to the surface of the substrate 21, the internal stress of the electromechanical transducer film 24 is likely to decrease, and thus a greater displacement is likely to be obtained.

Next, a description is given of the relationship between the shape of rocking curve (the presence or absence of a drop) and the method of producing the electromechanical transducer film 24. Electromechanical transducer elements having different full widths at half maximum in the rocking curve were produced with adjustments to the platinum film formation temperature (substrate temperature) at the time of production of the lower electrode 23. When the platinum film formation temperature (substrate temperature) at the time of production of the lower electrode 23 was 300° C., the full width at half maximum of the rocking curve varied within a range of not less than 7.7° and not greater than 9.4°. However, all the rocking curves took sharp shapes with one peak and no drop. The amounts of displacement were 0.2 μm or less.

When the platinum film formation temperature (substrate temperature) at the time of production of the lower electrode 23 was 300° C. or more and less than 400° C., the full width at half maximum of the rocking curve varied within a range of not less than 9.6° and not greater than 9.8°. Most of the rocking curves took sharp shapes with one peak. However, the rocking curve shape varied and no stable reproducibility was obtained.

When the platinum film formation temperature (substrate temperature) of at the time of production of the lower electrode 23 was 400° C. or more, the full width at half maximum of the rocking curve varied within a range of not less than 10°. When the full width at half maximum of the rocking curve was within a range of not less than 10° and not greater than 11.2°, most of the rocking curves took shapes with two peaks and a drop. Meanwhile, some of the rocking curves had a trapezoidal shape in which two peaks were linked almost linearly. The reproducibility was somewhat insufficient. However, when the full width at half maximum of the rocking curve was within a range of not less than 11.3° and not greater than 12.4°, all of the rocking curves take shapes with two peaks and a drop. High reproducibility was confirmed.

On the other hand, when the full width at half maximum of the rocking curve was 15°, the rocking curve took a broad shape, and the amount of displacement was small due to poor orientation.

The position (angle ω) of the drop A was near the center of the rocking curve in the present embodiment. However, it has been revealed that, even if the position was shifted to either one side, the same effect could be obtained. In addition, the positions (angles w) of the two peaks B1 and B2 were approximately symmetric with respect to the center of the rocking curve (46.229°) in the present embodiment. However, it has been revealed that, even if the peaks were shifted to either one side, the same effect could be obtained. Further, the positions (angle ω) of the two peaks B1 and B2 were almost the same in peak intensity in the present embodiment. However, it has been revealed that, even if the positions had different peak intensities, the same effect could be obtained.

Figure 11:
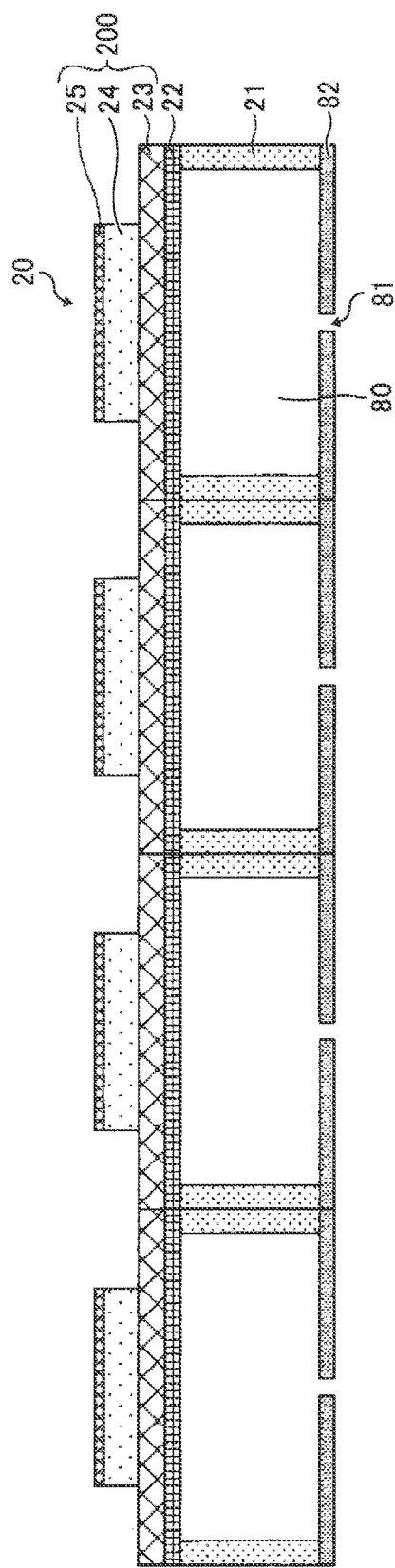
FIG. 11 is a cross-sectional view of a portion of a liquid discharge head cut along a nozzle array direction.

Next, a description is given of the liquid discharge head including the piezoelectric actuator chips as the electromechanical-transducing electronic components according to the present embodiment. FIG. 11 is a cross-sectional view of the liquid discharge head cut along the nozzle array direction.

As illustrated in FIG. 11, the liquid discharge head according to the present embodiment includes the nozzles 81 to discharge liquid, pressurizing liquid chambers 80 communicated with the nozzles 81, and piezoelectric actuators 20 as pressure generators to increase the pressure of liquid in the pressurizing liquid chambers 80. The piezoelectric actuator 20 includes the diaphragm 22 constituting part of a wall of the pressurizing liquid chamber 80 and the piezoelectric actuator chips as electromechanical-transducing electronic components including the plurality of electromechanical transducer elements 200 arranged on the diaphragm 22.

In the liquid discharge head according to the present embodiment, the pressurizing liquid chambers 80 are disposed in the substrate 21. A nozzle plate 82 including the nozzles 81 to discharge liquid is disposed at lower ends of the pressurizing liquid chambers 80. When a driving signal is applied to the electromechanical transducer element 200 to displace the electromechanical transducer film 24, the diaphragm 22 is deformed (the surface of the diaphragm 22 is displaced) to discharge liquid of the pressurizing liquid chamber 80 from the nozzle 81. The liquid discharge head may include, for example, a liquid supply unit to supply liquid, such as ink, to the pressurizing liquid chamber 80 and a channel through which liquid flows. In a configuration in which the droplet discharge head includes the channel, the fluid resistance of the channel against the liquid may be considered.

The width of the pressurizing liquid chamber 80 (the length of the pressurizing liquid chamber 80 in the nozzle array direction) in the present embodiment is preferably in a range of not less than 50 μm and not greater than 70 μm, and is more preferably in a range of not less than 55 μm and not greater than 65 μm. If the width of the pressurizing liquid chamber 80 is greater than 70 μm, the residual vibration is too large, thus making it difficult to secure the discharge performance at high frequencies. If the width of the pressurizing liquid chamber 80 is less than 50 μm, the diaphragm 22 is less deformed. Accordingly, a greater drive voltage is used to obtain a desired displacement amount. If the width of the pressurizing liquid chamber 80 varies among the nozzles 81, the amount of displacement of the diaphragm 22 also varies among nozzles 81, thus causing variation in the amount of liquid discharged from the nozzles 81. In particular, if a variation in the width of the pressurizing liquid chamber 80 among the nozzles 81 in nozzle row causes variation in the amount of liquid discharged from each of the nozzles 81 in nozzle row, for example, the image quality of the inkjet recording apparatus would be adversely affected. Therefore, regarding the width of each pressurizing liquid chamber 80, $\Delta L/L_{AVE}$ is preferably not greater than 2.5%, where $L_{AVE}$ represents an average of the width of the pressurizing liquid chamber 80 in nozzle row and $\Delta L$ represents a maximum difference in the width of the pressurizing liquid chamber 80 in nozzle row.

Note that, depending on the production process, the width of the pressurizing liquid chamber 80 in nozzle row may vary so that the width lineally increases or decreases along the nozzle array direction. For example, when a plurality of piezoelectric actuator chips (electromechanical-transducing electronic components) are produced from a single Si wafer, the width of the pressurizing liquid chamber 80 is likely to vary so that the width linearly increases or decreases in the nozzle array direction in the piezoelectric actuator chips manufactured in an area near an outer peripheral portion of the wafer. When such a variation arises, $\Delta L'/L_{AVE}$ is preferably not greater than ±2.5%, where $\Delta L'$ represents the rate of change (inclination) in the width of each pressurizing liquid chamber 80 in the nozzle array direction.

As a method of setting $\Delta L/L_{AVE}$ to be not greater than 2.5% or $\Delta L'/L_{AVE}$ to be within ±2.5%, for example, the width of the pressurizing liquid chamber 80 is adjusted at a step of designing a resist mask used to form the pressurizing liquid chamber 80 by etching.

Next, examples of the electromechanical transducer element 200 according to the present embodiment are described with comparative examples. Note that the examples of the electromechanical transducer element 200 are not limited to the following examples.

EXAMPLE 1

Next, a description is given of an example of the piezoelectric actuator chips in the present embodiment (hereinafter, the present example will be referred to as "Example 1"). In Example 1, first, as diaphragm constitution films, a film of $SiO_2$ (of a film thickness of 600 nm), a Si film (of a film thickness of 200 nm), a $SiO_2$ film (of a film thickness of 100 nm), a SiN film (of a film thickness of 150 nm), a $SiO_2$ film (of a film thickness of 130 nm), a SiN film (of a film thickness of 150 nm), a $SiO_2$ film (of a film thickness of 100 nm), a Si film (of a film thickness of 200 nm), and a $SiO_2$ film (of a film thickness of 600 nm) are formed in this order on a monocrystalline silicon substrate (6-inch silicon wafer) having the (100) plane orientation, to produce the diaphragm 22. At this time, the equivalent Young's modulus at the total thickness of the diaphragm 22 was calculated from the rigidity and film thickness of each single layer. Measurements were made about the film-thickness profile of a SiN film at which a greatest rigidity was obtained as a single layer and the film-thickness profile as the total thickness of the diaphragm 22.

A titanium film (of a film thickness of 20 nm) was formed at a film formation temperature of 350° C. using a sputtering apparatus, and then was thermally oxidized at 750° C. using a rapid thermal annealing (RTA) apparatus to form an adhesion film of the lower electrode 23. Subsequently, a platinum film (of a film thickness of 160 nm) was formed at a film formation temperature of 300° C. using the sputtering apparatus, to form the lower electrode 23.

Next, a solution adjusted so as to have a ratio of Pb:Ti=1:1 as a PbTiO$_3$ layer serving as a base layer of the electromechanical transducer film 24 and a solution (PZT precursor solution) adjusted so as to have a ratio of Pb:Zr:Ti=115:49:51 as the electromechanical transducer film 24 were prepared, and respective films were formed by a spin coating method. For synthesis of a PZT precursor solution, lead acetate trihydrate, titanium isopropoxide, and zirconium isopropoxide were used as starting materials. Crystal water of lead acetate was dissolved in methoxyethanol and was then dehydrated. The amount of lead is excessively large for a stoichiometric composition, to prevent reduction in crystallinity by so-called lead missing during heat treatment. The titanium isopropoxide and the zirconium isopropoxide were dissolved in methoxyethanol, an alcohol exchange reaction and an esterification reaction were advanced, a resultant was mixed with a methoxyethanol solution having dissolved the lead acetate, and the PZT precursor solution was synthesized. The concentration of PZT was 0.5 mol/L. The solution of the PbTiO$_3$ layer as the base layer was prepared similarly with the PZT precursor solution.

Using the solutions, first, the PbTiO$_3$ layer was formed (at a film thickness of 7 nm by spin coating and then drying was performed under 120° C. Then, a film was formed by spin coating method using the PZT precursor solution. Drying was performed at 120° C. and thermal decomposition was performed at 380° C. Drying and thermal decomposition were performed using a hot plate. At this time, the variation of the temperature of the hot plate was monitored and the temperature difference between a center portion and an outer peripheral portion of a wafer during thermal decomposition treatment was controlled. Thus, the hot plate was controlled so that the temperature was maintained within, for example, ±3° C.

After thermal decomposition treatment on the third layer was finished, crystallization heat treatment (at 730° C.) was performed by the RTA apparatus. At this time, similarly with the hot plate, the variation of the temperature of the RTA apparatus was monitored and the temperature difference between a center portion and an outer peripheral portion of a wafer during crystallization heat treatment was controlled. Thus, the RTA apparatus was controlled so that the temperature was maintained within, for example, ±3° C. The film thickness of the PZT thus formed was 240 nm. The above-described process was repeatedly performed eight times (a total of twenty-four layers) to from the electromechanical transducer film 24 at a film thickness of about 2 μm.

Next, as the upper electrode 25, an oxide film being a SrRuO$_3$ film (of a film thickness of 40 nm) and a metal film being a Pt film (of a film thickness of 125 nm) were formed by sputtering. Then, a film was formed by the spin coating method using a photoresist (TSMR8800) manufactured by TOKYO OHKA KOGYO., LTD, a resist pattern was formed by a normal photolithographic method, and an electrode pattern illustrated in FIGS. 3A and 3B was manufactured using an ICP etching device (manufactured by SAMCO INC.).

Next, an Al$_2$O$_3$ film having a film thickness of 50 nm was formed as a first insulation protective film 31, using an atomic layer deposition (ALD) method. At this time, Al of trimethylaluminum (TMA: manufactured by Sigma-Aldrich Co. LLC.) and O$_3$ generated by an ozone generator are alternately supplied as raw materials, and laminated for film formation.

Next, as illustrated in FIGS. 3A and 3B, contact holes 32 were formed by etching. Next, as a connector 35 between an upper electrode and a discrete electrode pad, a connector 37 between a lower electrode and a common electrode pad, a discrete electrode pad 34, and a common electrode pad 36, a film of Al was formed by sputtering and patterned by etching.

Next, as a second insulating protective film 38, a film of Si$_3$N$_4$ was formed at a film thickness of 500 nm by a plasma chemical vapor deposition (CVD) method. Then, openings were formed at positions of the discrete electrode pad 34 and the common electrode pad 36 Then, with the polarization processing device 40 illustrated in FIG. 4, polarization processing was performed on the electromechanical transducer element 200 by corona charging. A tungsten wire of φ50 μm was used as a corona electrode used for corona charging. Polarization processing conditions were a processing temperature of 80° C., a corona voltage of 9 kV, a grid voltage of 2.5 kV, a processing time of 30 sec, a distance between the corona electrode and the grid electrode to be 4 mm, and a distance between the grid electrode and a stage to be 4 mm. Then, as illustrated in FIG. 11, Si of the back face of the wafer was etched to produce the pressurizing liquid chambers 80, each having the width (the length in the nozzle array direction) of 60 nm, and the nozzle plate 82, in which the nozzles 81 to discharge liquid were formed, was bonded to the back face of the wafer.

Figure 12:
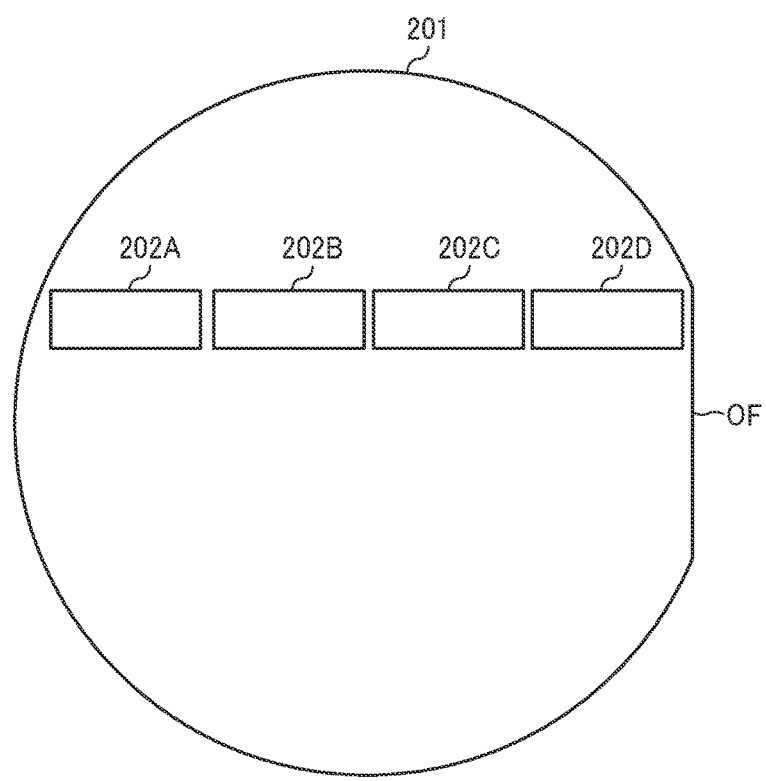
FIG. 12 is a schematic plan view of a Si wafer in which a plurality of piezoelectric actuator chips has been formed.
Figure 13:
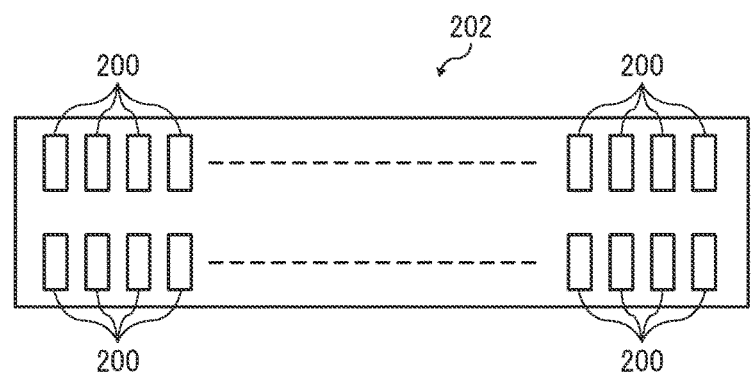
FIG. 13 is a schematic plan view of one of the piezoelectric actuator chips formed on the Si wafer of FIG. 12.

FIG. 12 is a schematic plan view of the Si wafer in which a plurality of piezoelectric actuator chips has been formed. FIG. 13 is a schematic plan view of one of the piezoelectric actuator chips. Through the production process of Example 1, the plurality of piezoelectric actuator chips 202 illustrated in FIG. 13, in each of which the plurality of electromechanical transducer elements 200 are arrayed along the nozzle row, are simultaneously formed on the Si wafer 201 as illustrated in FIG. 12. Note that, though only a part of the piezoelectric actuator chips 202 are illustrated in FIG. 12, the piezoelectric actuator chips 202 are entirely formed on the Si wafer 201.

Here, as in the present embodiment, when the plurality of piezoelectric actuator chips 202 is formed on the Si wafer 201, for example, the film thickness and quality vary, in particular, from the center portion to the outer peripheral portion of the wafer among different types of films formed at manufacturing steps Such variation causes variation in the displacement amount of the diaphragm 22 among the electromechanical transducer elements 200 in each piezoelectric actuator chip 202, thus causing a failure of variation among nozzles 81 in discharging performance, such as the amount and speed of ink discharged from each nozzle 81. In particular, as in the present embodiment, when the electromechanical transducer film 24 having the crystal structure in which the drop A is present in the rocking curve, variation in, e.g., the film thickness and quality of the electromechanical transducer film 24 is likely to affect the variation in the amount of displacement of the electromechanical transducer element 200 and is likely to cause variation in the amount of displacement of the diaphragm 22 among the electromechanical transducer elements 200.

Figure 14:
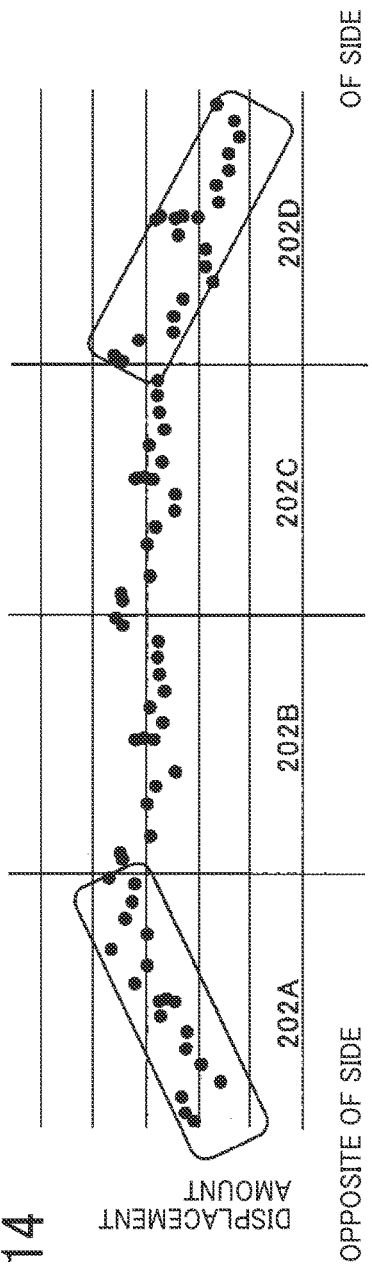
FIG. 14 is an illustration of an example of the displacement amount of the diaphragm generated by electromechanical transducer elements in four piezoelectric actuator chips illustrated in FIG. 12.

FIG. 14 is an illustration of an example of the amounts of displacement of the diaphragm 22 created by the electromechanical transducer elements 200 in four piezoelectric actuator chips 202A, 202B, 202C, and 202D illustrated in FIG. 12. In the example illustrated in FIG. 14, the piezoelectric actuator chips 202B and 202C formed at positions closer to the center portion of the wafer 201 have less variations in the amount of displacement among the electromechanical transducer elements 200. By contrast, the piezoelectric actuator chips 202A and 202D (the piezoelectric actuator chip 202D close to an orientation flat (OF) of the wafer 201 and the piezoelectric actuator chip 202A close to an outer peripheral portion (opposite OF) at an opposite side of the OF of the wafer 201) have greater variations in the amount of displacement among the electromechanical transducer elements 200. In particular, in the present embodiment, the amount of displacement is gradually smaller toward the outer peripheral portion of the wafer 201 in each of the piezoelectric actuator chips 202A and 202D closer to the outer peripheral portion of the wafer 201.

In the example illustrated in FIG. 14, the nozzle array direction in each of the piezoelectric actuator chips 202A and 202D closer to the outer peripheral portion of the wafer 201 extends from the center portion to the outer peripheral portion of the wafer 201. Accordingly, in the piezoelectric actuator chips 202A and 202D, the amount of displacement of the electromechanical transducer element 200 is linearly smaller or greater along the nozzle array direction. Thus, if the piezoelectric actuator chips 202A and 202D are mounted on the liquid discharge head, discharging performances, such as the amount and speed of ink discharged from the nozzles, would vary in each nozzle row, thus reducing image qualities.

Consequently, the yield rates of the piezoelectric actuator chips 202A and 202D closer to the outer peripheral portion of the wafer 201 reduce, thus increasing the cost. If the driving signals applied to the piezoelectric actuator chips 202A and 202D are separately adjusted for each electromechanical transducer element 200, such variation in the amount of displacement among the electromechanical transducer elements 200 can be reduced. However, in such a case, driving signals for a plurality of waveforms are needed in the inkjet recording apparatus including the liquid discharge head mounted with the piezoelectric actuator chips 202A and 202D, thus increasing the cost of the entire inkjet recording apparatus.

Hence, in Example 1, even in the piezoelectric actuator chips 202A and 202D closer to the outer peripheral portion of the wafer 201, the variation of the displacement amount of the diaphragm 22 among the electromechanical transducer elements 200 in the nozzle row is set to be within 8%. For example, the value of $\Delta\delta/\delta_{AVE}$ is set to be equal to or less than 8%, where $\delta_{AVE}$ represents the average value of the displacement amount $\delta$ in each nozzle row on application of an electric field having an intensity of 150 kV/cm and $\Delta\delta$ represents a maximum difference of the displacement amount $\delta$ in the nozzle row.

The variation of the displacement amount of the diaphragm 22 among the electromechanical transducer elements 200 is affected by the variation in, e.g., the thickness and quality of different types of films formed on the Si wafer 201. As in the present embodiment, the piezoelectric actuator chip 202 using the electromechanical transducer film 24 having the crystal structure with the drop A in the rocking curve is more likely to be affected by the variation of the crystal structure of the electromechanical transducer film 24 among the electromechanical transducer elements 200 in the nozzle row, which is desirable to be improved.

Figure 15:
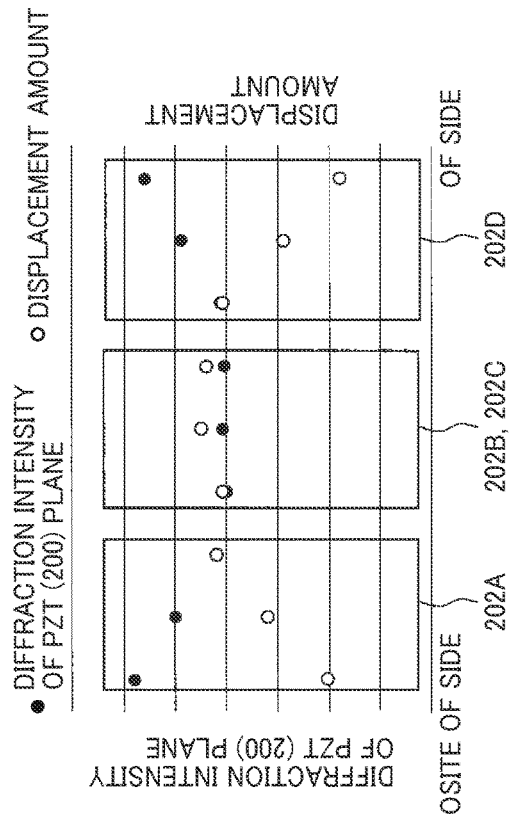
FIG. 15 is a graph of relationship between the displacement amount δ and a diffraction peak intensity P corresponding to the (200) plane obtained by measurements according to the X-ray diffraction θ-2θ method, of piezoelectric actuator chips closer to a center portion of the wafer and the piezoelectric actuator chips closer to an outer peripheral portion of the wafer.

FIG. 15 is a graph of relationship between the displacement amount $\delta$ and the diffraction peak intensity P corresponding to the (200) plane obtained by measurements according to a $\theta$-$2\theta$ method of X-ray diffraction, of the piezoelectric actuator chips 202B and 202C closer to the center portion of the wafer 201 and the piezoelectric actuator chips 202A and 202D closer to the outer peripheral portion of the wafer 201. Note that, in the graph of FIG. 15, the diffraction peak intensities P corresponding to three nozzles 81 at the center portion and both ends of the nozzle row in each of the piezoelectric actuator chips 202A through 202D are plotted.

As illustrated in FIG. 15, the present inventor has found that there is a high correlation between the displacement amount $\delta$ and the diffraction peak intensity P corresponding to the (200) plane and reducing the variation in the diffraction peak intensity P can reduce the variation in the displacement amount $\delta$. When $\Delta P/P_{AVE}$ is equal to or less than 20% where $P_{AVE}$ represents the average value of the diffraction peak intensity P in the nozzle row in the electromechanical transducer film 24 of each electromechanical transducer element 200 and $\Delta P$ represents the maximum difference of the diffraction peak intensity P in the nozzle row, the variation of the displacement amount of the diaphragm 22 among the electromechanical transducer elements 200 in the nozzle row can be kept within 8% even at positions close to the outer peripheral portion of the wafer 201 in the piezoelectric actuator chip 202 using the electromechanical transducer film 24 having the crystal structure with the drop A in the rocking curve.

Note that, in Example 1, as illustrated in FIGS. 14 and 15, the displacement amount $\delta$ of the diaphragm 22 in the nozzle row varies so as to linearly increase or decrease along the nozzle array direction. In the case of such a variation, as illustrated in FIG. 15, the diffraction peak intensity P in the nozzle row also varies so as to linearly increase or decrease along the nozzle array direction. In such a case, the value of $\Delta P'/P_{AVE}$ is preferably within $\pm 20\%$, where $\Delta P'$ represents the change rate (inclination) of the diffraction peak intensity P in the nozzle array direction.

For the variation of the diffraction peak intensity P in the nozzle row in the piezoelectric actuator chips 202A and 202D closer to the outer peripheral portion of the wafer 201, an effective method of keeping the value of $\Delta P/P_{AVE}$ to be equal to or less than 20% or the value of $\Delta P'/P_{AVE}$ to be within $\pm 20\%$ is, for example, to provide an orientation control layer made of, e.g., lead titanate (PT), or a seed layer between the lower electrode 23 and the electromechanical transducer film 24 and control the surface roughness or particle diameter of the orientation control layer or the seed layer. Another effective method is, for example, to conduct operation and control to reduce the variation of temperature or atmosphere in the surface direction of the wafer in the processes, such as drying, temporary baking, and baking, on film formation of the electromechanical transducer film 24. In Example 1, as described above, in thermal decomposition treatment after spin coating of the PZT precursor solution, the variation of the hot plate was monitored and the temperature difference between the center portion and the outer peripheral portion of the wafer during thermal decomposition treatment was controlled. Thus, the hot plate was controlled so that the temperature was maintained within $\pm 3°$ C. The variation of the temperature of the RTA apparatus was monitored during crystallization heat treatment. The RTA apparatus was controlled so that the temperature difference between the center portion and the outer peripheral portion of the wafer during crystallization heat treatment was maintained within $\pm 3°$ C.

Figure 16:
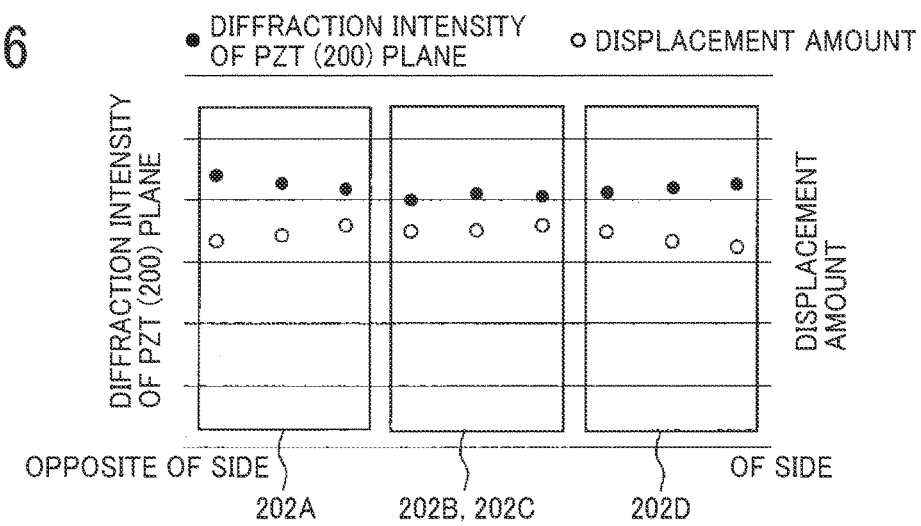
FIG. 16 is a graph of relationship between the diffraction peak intensity P and the displacement amount δ in piezoelectric actuator chips and closer to a center portion of the wafer and piezoelectric actuator chips closer to an outer peripheral portion of the wafer in Example 1.

FIG. 16 is a graph of relationship between the diffraction peak intensity P and the displacement amount $\delta$ in the piezoelectric actuator chips 202B and 202C closer to the center portion of the wafer 201 and the piezoelectric actuator chips 202A and 202D closer to the outer peripheral portion of the wafer 201 in Example 1. According to Example 1, in not only the piezoelectric actuator chips 202B and 202C closer to the center portion of the wafer 201 but also the piezoelectric actuator chips 202A and 202D closer to the outer peripheral portion of the wafer 201, the value of $\Delta P/P_{AVE}$ is maintained to be equal to or less than 20% or the value of $\Delta P'/P_{AVE}$ is maintained within ±20%. As a result, in the piezoelectric actuator chips 202A and 202D closer to the outer peripheral portion of the wafer 201, similarly with the piezoelectric actuator chips 202B and 202C closer to the center portion of the wafer 201, the variation of the displacement amount of the diaphragm 22 among the electromechanical transducer elements 200 in the nozzle row is maintained within 8%.

EXAMPLE 2

Next, a description is given of another example of the piezoelectric actuator chips in the present embodiment (hereinafter, the present example will be referred to as "Example 2"). Example 2 is similar to the above-described Example 1 except that a solution prepared in a ratio of Pb:Zr:Ti=115:45:55 was used as the PZT precursor solution in film formation of the electromechanical transducer film 24.

EXAMPLE 3

Next, a description is given of still another example of the piezoelectric actuator chips in the present embodiment (hereinafter, the present example is referred to as "Example 3"). Example 3 is similar to the above-described Example 1 except that, in Example 3, a solution prepared in a ratio of Pb:Zr:Ti=115:55:45 was used as the PZT precursor solution in film formation of the electromechanical transducer film 24.

EXAMPLE 4

Next, a description is given of still another example of the piezoelectric actuator chips in the present embodiment (hereinafter, the present example is referred to as "Example 4"). Example 4 is similar to the above-described Example 1 except for the following points. That is, for Example 4, in the film formation of the electromechanical transducer film 24, thermal decomposition treatment was performed in a state in which the temperature difference (the variation in temporary baking temperature) of the hot plate between the center portion and the outer peripheral portion of the wafer was 10° C. and crystallization heat treatment was performed in a state in which the temperature difference (the variation in temporary baking temperature) of the RTA apparatus between the center portion and the outer peripheral portion of the wafer was 10° C.

EXAMPLE 5

Next, a description is given of still another example of the piezoelectric actuator chips in the present embodiment (hereinafter, the present example is referred to as "Example 5"). Example 5 is similar to the above-described Example 1 except for the following points. That is, for Example 5, in the film formation of the electromechanical transducer film 24, thermal decomposition treatment was performed in a state in which the temperature difference (the variation in temporary baking temperature) of the hot plate between the center portion and the outer peripheral portion of the wafer was 15° C. and crystallization heat treatment was performed in a state in which the temperature difference (the variation in temporary baking temperature) of the RTA apparatus between the center portion and the outer peripheral portion of the wafer was 15° C.

COMPARATIVE EXAMPLE 1

Next, a description is given of a comparative example of the piezoelectric actuator chips in the present embodiment (hereinafter, the present comparative example is referred to as "Comparative Example 1"). Comparative Example 1 is similar to the above-described Example 1 except for the following points. That is, for Comparative Example 1, a $TiO_2$ layer was formed at 7 nm as the base layer (seed layer) of the electromechanical transducer film 24 by the sputtering method. In the film formation of the electromechanical transducer film 24, thermal decomposition treatment was performed in a state in which the temperature difference (the variation in temporary baking temperature) of the hot plate between the center portion and the outer peripheral portion of the wafer was 25° C. and crystallization heat treatment was performed in a state in which the temperature difference (the variation in temporary baking temperature) of the RTA apparatus between the center portion and the outer peripheral portion of the wafer was 25° C.

COMPARATIVE EXAMPLE 2

Next, a description is given of another comparative example of the piezoelectric actuator chips in the present embodiment (hereinafter, the present comparative example is referred to as "Comparative example 2"). Comparative Example 2 is similar to the above-described Example 1 except that, in Comparative Example 2, a solution prepared in a ratio of Pb:Zr:Ti=115:57:43 was used as the PZT precursor solution in film formation of the electromechanical transducer film 24.

COMPARATIVE EXAMPLE 3

Next, a description is given of still another comparative example of the piezoelectric actuator chips in the present embodiment (hereinafter, the present comparative example is referred to as "Comparative Example 3"). Comparative Example 3 is similar to the above-described Example 1 except for the following points. That is, for Comparative Example 3, a solution prepared in a ratio of Pb:Zr:Ti=115:41:59 was used as the PZT precursor solution in film formation of the electromechanical transducer film 24. In the film formation of the electromechanical transducer film 24, thermal decomposition treatment was performed in a state in which the temperature difference (the variation in temporary baking temperature) of the hot plate between the center portion and the outer peripheral portion of the wafer was 25° C. and crystallization heat treatment was performed in a state in which the temperature difference (the variation in temporary baking temperature) of the RTA apparatus between the center portion and the outer peripheral portion of the wafer was 25° C.

Table 1-1 and Table 1-2 are tables of results of various types of measurements under various conditions on the above-described Examples 1 through 5 and Comparative Examples 1 through 3. For the piezoelectric actuator chips closer to the outer peripheral portion of the wafer 201 in the above-described Examples 1 through 5 and Comparative Examples 1 through 3, the relationship among the diffraction peak intensities P, P1, and P2 and the displacement amount δ. After the pressurizing liquid chamber 80 was formed on a back surface of a Si wafer on which piezoelectric actuator chips were formed, an electric field of 150 kV/cm was applied in a state in which the nozzle plate 82 was not bonded. The deformation amount at that time was measured as the displacement amount δ by a laser Doppler vibrometer. The piezoelectric constant d31 was calculated by simulation using the results of measurements.

TABLE 1-1

|  | Ti/ (Zr + Ti) | Seed | Variation in Temporary Baking Temperature | Variation in Baking temperature |
| --- | --- | --- | --- | --- |
| Example 1 | 51 | PT | 3° C. | 3° C. |
| Example 2 | 55 | PT | 3° C. | 3° C. |
| Example 3 | 45 | PT | 3° C. | 3° C. |
| Example 4 | 51 | PT | 10° C. | 10° C. |
| Example 5 | 51 | PT | 15° C. | 15° C. |
| Comparative Example 1 | 51 | $TiO_2$ | 25° C. | 25° C. |
| Comparative Example 2 | 43 | PT | 3° C. | 3° C. |
| Comparative Example 3 | 59 | PT | 25° C. | 25° C. |

TABLE 1-2

|  | $\Delta P/P_{AVE}$ | $\Delta P1/P1_{AVE}$ | $\Delta P2/P2_{AVE}$ | d31 | $\Delta\delta/\delta_{AVE}$ |
| --- | --- | --- | --- | --- | --- |
| Example 1 | 3.2% | 3.4% | 3.1% | 145 | 1.5% |
| Example 2 | 2.9% | 2.8% | 3.1% | 132 | 1.6% |
| Example 3 | 2.5% | 2.6% | 2.6% | 128 | 0.5% |
| Example 4 | 8.3% | 8.3% | 8.2% | 140 | 5.2% |
| Example 5 | 19.2% | 18.9% | 18.7% | 138 | 7.4% |
| Comparative Example 1 | 23.2% | 24.1% | 23.7% | 125 | 14.2% |
| Comparative Example 2 | 2.4% | 2.5% | 2.6% | 107 | 1.1% |
| Comparative Example 3 | 22.1% | 22.3% | 22.4% | 119 | 15.8% |

In the above-described Table 1-2, ΔP1 represents a maximum difference in the nozzle row of the diffraction peak intensity P1 of χ=0° obtained when the diffraction intensity was measured only by slightly changing the tilt angle (χ) of the substrate surface of the sample in a state in which the incident angle of an X ray and the angle (2θ) of a detector are fixed at a position where the diffraction intensity measured by the θ-2θ method is largest. $P1_{AVE}$ represents an average value in the nozzle row of the diffraction peak intensity P1 of χ=0° in the electromechanical transducer films 24 of the electromechanical transducer elements 200. When $\Delta P1/P1_{AVE}$ is equal to or less than 20%, the variation of the displacement amount of the diaphragm 22 among the electromechanical transducer elements 200 in the nozzle row can be kept within 8% even at positions close to the outer peripheral portion of the wafer 201 in the piezoelectric actuator chip 202 using the electromechanical transducer film 24 having the crystal structure with the drop A in the rocking curve.

Note that, when the displacement amount δ of the diaphragm 22 in the nozzle row varies so as to linearly increase or decrease along the nozzle array direction, the diffraction peak intensity P1 of χ=0° in each nozzle row also varies so as to linearly increase or decrease along the nozzle array direction. In such a case, the value of $\Delta P1'/P1_{AVE}$ is preferably within ±20%, where ΔP1' represents the change rate (inclination) of the diffraction peak intensity P1 of χ=0° in the nozzle array direction.

In the above-described Table 1-2, ΔP2 represents a maximum difference in the nozzle row of the diffraction peak intensity P at a position corresponding to ω=θmax/2 in a post-correction rocking curve having been corrected by irradiated area correction. $P2_{AVE}$ is an average value of the diffraction peak intensity P2 in the nozzle row. Here, the post-correction rocking curve is obtained by multiplying sin ω at each position ω by the diffraction intensity of the rocking curve corresponding to the (200) plane and/or the (002) plane measured at a position (2θ=θmax) of the diffraction peak intensity P at which the diffraction intensity is largest in the diffraction intensity peak(s) of corresponding to the (200) plane and/or the (002) plane among diffraction intensity peaks obtained by measurement according to the θ-2θ method of X-ray diffraction When $\Delta P2/P2_{AVE}$ is equal to or less than 20%, the variation of the displacement amount of the diaphragm 22 among the electromechanical transducer elements 200 in the nozzle row can be kept within 8% even at positions close to the outer peripheral portion of the wafer 201 in the piezoelectric actuator chip 202 using the electromechanical transducer film 24 having the crystal structure with the drop A in the rocking curve. Note that, when the displacement amount δ of the diaphragm 22 in the nozzle row varies so as to linearly increase or decrease along the nozzle array direction, the diffraction peak intensity P2 in each nozzle row also varies so as to linearly increase or decrease along the nozzle array direction. In such a case, the value of $\Delta P2'/P2_{AVE}$ is preferably within ±20%, where ΔP2' represents the change rate (inclination) of the diffraction peak intensity P2 in the nozzle array direction.

In the electromechanical transducer film 24 having the crystal structure with the drop A in the rocking curve, as described above, the percentage of the crystal portions (the crystal portions corresponding to the first rocking curve component I1 and the third rocking curve component I3 illustrated in FIG. 9) having a crystal orientation in a direction inclined relative to the surface of the substrate 21 is relatively large. It is considered that the presence of a large number of twin planes results in an increase in the displacement amount of the diaphragm 22. As an index value indicating the percentage of twin plane in the electromechanical transducer film 24, for example, $\Delta P/P_{AVE}$, $\Delta P'/P_{AVE}$, $\Delta P1/P1_{AVE}$, $\Delta P1'/P1_{AVE}$, $\Delta P2/P2_{AVE}$, and $\Delta P2'/P2_{AVE}$ are highly correlated with the percentage of twin plane. The variation in the displacement amount δ of the diaphragm 22 is also highly correlated with the percentage of twin plane.

Note that $\Delta P/P_{AVE}$, $\Delta P'/P_{AVE}$, $\Delta P1/P1_{AVE}$, $\Delta P1'/P1_{AVE}$, $\Delta P2/P2_{AVE}$, and $\Delta P2'/P2_{AVE}$ are preferably within 20%, and more preferably within 10%.

In Examples 1 through 5, the variation $\Delta\delta/\delta_{AVE}$ of the displacement amount δ in the nozzle row was within ±8%. For the piezoelectric constant d31, Examples 1 through 5 had properties equivalent to the properties of a general ceramic sintered body (i.t., the piezoelectric constant is in a range from −120 pm/V to −160 pm/V. By contrast, in Comparative Examples 1 and 3, the variation $\Delta\delta/\delta_{AVE}$ of the displacement amount in the nozzle row was largely deviated from the range of ±8%. For Comparative example 2, a sufficient piezoelectric constant d31 was not obtained and the displacement amount needed for discharging liquid was not obtained.

In addition, liquid discharge heads mounting the piezoelectric actuator chips according to the above-described Examples 1 through 5 and the above-described Comparative Examples 1 and 3 were manufactured and evaluated for liquid discharge. In the discharge evaluation, ink having a viscosity of 5 cp was used. A drive voltage of from −10V to −30V was applied by a simple push waveform, and the discharge state was checked. In the discharge evaluation, it was observed that, in any of the liquid discharge heads, ink was discharged from all of the nozzles 81 and high-frequency driving for discharge was performed. On the other hand, for Comparative Example 1 and Comparative Example 3, it was observed that the discharge speed greatly varied in the nozzle row.

EXAMPLE 6

Next, a description is given of another example of the piezoelectric actuator chips in the present embodiment (hereinafter, the present example will be referred to as "Example 6"). The piezoelectric actuator chips of Example 6 were manufactured with the same materials and manufacturing conditions as the above-described Example 1. Values of Pb/(Zr+Ti) in Table 2-1 are results of analysis of post-evaluation samples according to an inductively coupled plasma (ICP) emission spectrometry (high-frequency inductively coupled plasma emission spectrometry).

Figure 17:
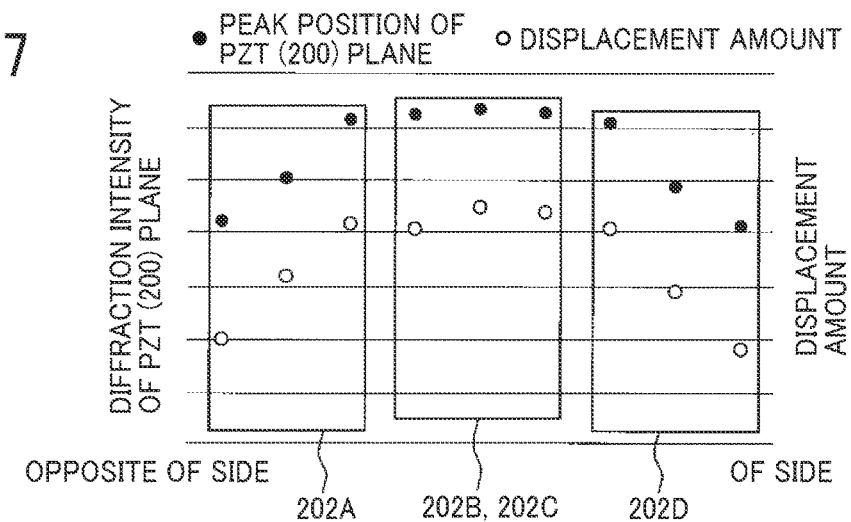
FIG. 17 is a graph of relationship between the displacement amount δ and a position θ1max of a diffraction peak intensity P1 corresponding to the (200) plane obtained by measurements according to the X-ray diffraction θ-2θ method, of piezoelectric actuator chips closer to a center portion of the wafer and the piezoelectric actuator chips closer to an outer peripheral portion of the wafer.

FIG. 17 is a graph of relationship between the displacement amount δ and the position (2θ=θ1max) of the diffraction peak intensity P1 corresponding to the (200) plane obtained by measurements according to the θ-2θ method of X-ray diffraction, of the piezoelectric actuator chips 202B and 202C closer to the center portion of the wafer 201 and the piezoelectric actuator chips 202A and 202D closer to the outer peripheral portion of the wafer 201. Note that, in the graph of FIG. 17, the positions (hereinafter, peak positions) θ1max of the diffraction peak intensities P1 corresponding to three nozzles 81 at the center portion and both ends of the nozzle row are plotted in each of the piezoelectric actuator chips 202A through 202D.

As illustrated in FIG. 17, the present inventor has found that there is a high correlation between the displacement amount δ and the peak position θ1max of the diffraction peak intensity P1 corresponding to the (200) plane and reducing the variation in the peak position θ1max can reduce the variation in the displacement amount δ. When the maximum difference Δθ1max in the nozzle row of the peak position θ1max in the electromechanical transducer film 24 of each electromechanical transducer element 200 is equal to or less than 0.02°, the variation of the displacement amount of the diaphragm 22 among the electromechanical transducer elements 200 in the nozzle row can be kept within 8% even at positions close to the outer peripheral portion of the wafer 201 in the piezoelectric actuator chip 202 using the electromechanical transducer film 24 having the crystal structure with the drop A in the rocking curve.

At this time, the peak position θ1max may be defined as a relative value to a position (peak position) θ2max of the diffraction peak intensity P2 of the (111) plane corresponding to lead titanate (PT) as the base layer (seed layer) of the electromechanical transducer film 24. For example, using a difference value between the peak position θ1max of the electromechanical transducer film 24 and the peak position θ2max of lead titanate (PT), the maximum difference Δθ12max of the difference value in the nozzle row is set to be equal to or less than 0.02°. In such a case, the variation of the displacement amount of the diaphragm 22 among the electromechanical transducer elements 200 in the nozzle row can also be kept within 8% even at positions close to the outer peripheral portion of the wafer 201 in the piezoelectric actuator chip 202 using the electromechanical transducer film 24 having the crystal structure with the drop A in the rocking curve.

Note that, in Example 6, as illustrated in FIGS. 14 and 17, the displacement amount δ of the diaphragm 22 in the nozzle row varies so as to linearly increase or decrease along the nozzle array direction. In the case of such a variation, as illustrated in FIG. 17, the peak position θ1max in the nozzle row also varies so as to linearly displace along the nozzle array direction.

In the piezoelectric actuator chips 202A and 202D closer to the outer peripheral portion of the wafer 201, an effective method of keeping the maximum difference Δθ1max of the peak position θ1max in the nozzle row to be equal to or less than 0.02° is, for example, to provide an orientation control layer made of, e.g., lead titanate (PT), or a seed layer between the lower electrode 23 and the electromechanical transducer film 24 and control the surface roughness or particle diameter of the orientation control layer or the seed layer. This is the same as in a case in which the maximum difference Δθ12max in the nozzle row of the difference value between the peak position θ1max of the electromechanical transducer film 24 and the peak position θ2max of lead titanate (PT) is kept to be equal to or less than 0.02°.

Another effective method is, for example, to conduct operation and control to reduce the variation of temperature or atmosphere in the surface direction of the wafer in the processes, such as drying, temporary baking, and baking, on film formation of the electromechanical transducer film 24. This is the same as in a case in which the maximum difference Δθ12max in the nozzle row of the difference value between the peak position θ1max of the electromechanical transducer film 24 and the peak position θ2max of lead titanate (PT) is kept to be equal to or less than 0.02°. In Example 6, as described above, in thermal decomposition treatment after spin coating of the PZT precursor solution, the variation of the hot plate was monitored and the temperature difference between the center portion and the outer peripheral portion of the wafer during thermal decomposition treatment was controlled. Thus, the hot plate was controlled so that the temperature was maintained within ±3° C. The variation of the temperature of the RTA apparatus was monitored during crystallization heat treatment. The RTA apparatus was controlled so that the temperature difference between the center portion and the outer peripheral portion of the wafer during crystallization heat treatment was maintained within ±3° C.

At this time, the maximum difference ΔPb in the element array of the composition ratio (Pb/(Zr+Ti)) of lead (Pb), zirconium (Zr), and titanium (Ti) obtained by the ICP analysis is preferably equal to or less than 10%, more preferably equal to or less than 5%. The average value $Pb_{AVE}$ of the composition ratio (Pb/(Zr+Ti)) of lead (Pb), zirconium (Zr), and titanium (Ti) in the element array is preferably in a range of not less than 100% and not greater than 120%, more preferably in a range of not less than 105% and not greater than 115%. The amount of lead (Pb) in the electromechanical transducer film 24 greatly affects the variation in, e.g., the film thickness and quality in the wafer surface. If $Pb_{AVE}$ is smaller than 100%, the variation in the amount of lead (Pb) in the wafer surface is relatively large (ΔPb is relatively large) and the lead (Pb) in the crystal structure of the electromechanical transducer film 24 is short, thus resulting in insufficient piezoelectric performance. By contrast, if $Pb_{AVE}$ is greater than 120%, the amount of PbO exiting outside the crystal system in the electromechanical transducer film 24 increases, thus causing a failure, such as electric current leakage. Therefore, a process control is preferably performed to reduce the variation in the amount of lead (Pb) in the wafer surface of the electromechanical transducer film 24 while keeping the amount of lead (Pb) in a proper range.

In addition, the maximum difference ΔTi in the element array of the composition ratio (Ti/(Zr+Ti)) of zirconium (Zr) and titanium (Ti) obtained by the ICP analysis is preferably equal to or less than 2%. More preferably, ΔTi is equal to or less than 1%. This is because the amount of titanium (Ti) in the electromechanical transducer film 24 also greatly affects the variation in, e.g., the film thickness and quality of the wafer surface.

Figure 18:
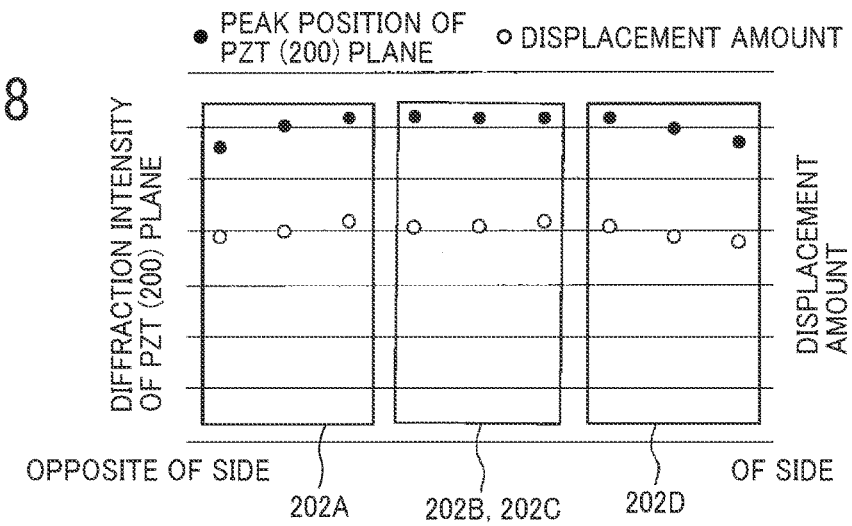
FIG. 18 is a graph of relationship between the peak position θ1max of the diffraction peak intensity P1 and the displacement amount δ in piezoelectric actuator chips and closer to a center portion of the wafer and piezoelectric actuator chips closer to an outer peripheral portion of the wafer in Example 6.

FIG. 18 is a graph of relationship between the peak position θ1max of the diffraction peak intensity P1 and the displacement amount δ in the piezoelectric actuator chips 202B and 202C closer to the center portion of the wafer 201 and the piezoelectric actuator chips 202A and 202D closer to the outer peripheral portion of the wafer 201 in Example 6. According to Example 6, in not only the piezoelectric actuator chips 202B and 202C closer to the center portion of the wafer 201 but also the piezoelectric actuator chips 202A and 202D closer to the outer peripheral portion of the wafer 201, the maximum difference Δθ1max of the peak position θ1max in the nozzle row or the maximum difference Δθ12max of the difference value of the peak position θ1max and the peak position θ2max in the nozzle row is equal to or less than 0.02°. As a result, in the piezoelectric actuator chips 202A and 202D closer to the outer peripheral portion of the wafer 201, similarly with the piezoelectric actuator chips 202B and 202C closer to the center portion of the wafer 201, the variation of the displacement amount of the diaphragm 22 among the electromechanical transducer elements 200 in the nozzle row is maintained within 8%.

EXAMPLE 7

Next, a description is given of another example of the piezoelectric actuator chips in the present embodiment (hereinafter, the present example will be referred to as "Example 7"). Example 7 is similar to the above-described Example 6 except that a solution prepared in a ratio of Pb:Zr:Ti=115:45:55 was used the PZT precursor solution in film formation of the electromechanical transducer film 24.

EXAMPLE 8

Next, a description is given of still another example of the piezoelectric actuator chips in the present embodiment (hereinafter, the present example is referred to as "Example 8"). Example 8 is similar to the above-described Example 6 except that a solution prepared in a ratio of Pb:Zr:Ti=118:55:45 was used as the PZT precursor solution in film formation of the electromechanical transducer film 24.

EXAMPLE 9

Next, a description is given of still another example of the piezoelectric actuator chips in the present embodiment (hereinafter, the present example is referred to as "Example 9"). Example 9 is similar to the above-described Example 6 except for the following points. That is, for Example 9, a solution prepared in a ratio of Pb:Zr:Ti=121:49:51 was used as the PZT precursor solution in film formation of the electromechanical transducer film 24. In the film formation of the electromechanical transducer film 24, thermal decomposition treatment was performed in a state in which the temperature difference (the variation in temporary baking temperature) of the hot plate between the center portion and the outer peripheral portion of the wafer was 10° C. and crystallization heat treatment was performed in a state in which the temperature difference (the variation in temporary baking temperature) of the RTA apparatus between the center portion and the outer peripheral portion of the wafer was 10° C.

EXAMPLE 10

Next, a description is given of still another example of the piezoelectric actuator chips in the present embodiment (hereinafter, the present example is referred to as "Example 10"). Example 10 is similar to the above-described Example 6 except for the following points. That is, for Example 10, a solution prepared in a ratio of Pb:Zr:Ti=108:49:51 was used as the PZT precursor solution in film formation of the electromechanical transducer film 24. In the film formation of the electromechanical transducer film 24, thermal decomposition treatment was performed in a state in which the temperature difference (the variation in temporary baking temperature) of the hot plate between the center portion and the outer peripheral portion of the wafer was 15° C. and crystallization heat treatment was performed in a state in which the temperature difference (the variation in temporary baking temperature) of the RTA apparatus between the center portion and the outer peripheral portion of the wafer was 15° C.

COMPARATIVE EXAMPLE 4

Next, a description is given of a comparative example of the piezoelectric actuator chips in the present embodiment (hereinafter, the present comparative example is referred to as "Comparative Example 4"). Comparative Example 4 is similar to the above-described Example 6 except for the following points. That is, for Comparative Example 4, a TiO$_2$ layer was formed at 7 nm as a base layer (seed layer) of the electromechanical transducer film 24 by the sputtering method. A solution prepared in a ratio of Pb:Zr:Ti=100:37:63 was used as the PZT precursor solution used in film formation of the electromechanical transducer film 24. In the film formation of the electromechanical transducer film 24, thermal decomposition treatment was performed in a state in which the temperature difference (the variation in temporary baking temperature) of the hot plate between the center portion and the outer peripheral portion of the wafer was 25° C. and crystallization heat treatment was performed in a state in which the temperature difference (the variation in temporary baking temperature) of the RTA apparatus between the center portion and the outer peripheral portion of the wafer was 25° C.

COMPARATIVE EXAMPLE 5

Next, a description is given of another comparative example of the piezoelectric actuator chips in the present embodiment (hereinafter, the present comparative example is referred to as "Comparative example 5"). Comparative Example 5 is similar to the above-described Example 6 except that, in Comparative Example 6, a solution prepared in a ratio of Pb:Zr:Ti=130:57:43 was used as the PZT precursor solution in film formation of the electromechanical transducer film 24.

COMPARATIVE EXAMPLE 6

Next, a description is given of still another comparative example of the piezoelectric actuator chips in the present embodiment (hereinafter, the present comparative example is referred to as "Comparative Example 6"). Comparative Example 6 is similar to the above-described Example 6 except for the following points. That is, for Comparative Example 6, a solution prepared in a ratio of Pb:Zr:Ti=118:41:59 was used as the PZT precursor solution in film formation of the electromechanical transducer film 24. In the film formation of the electromechanical transducer film 24, thermal decomposition treatment was performed in a state in which the temperature difference (the variation in temporary baking temperature) of the hot plate between the center portion and the outer peripheral portion of the wafer was 25° C. and crystallization heat treatment was performed in a state in which the temperature difference (the variation in temporary baking temperature) of the RTA apparatus between the center portion and the outer peripheral portion of the wafer was 25° C.

Table 2-1 and Table 2-2 are tables of results of various types of measurements under various conditions on the above-described Examples 6 through 10 and Comparative Examples 4 through 6. Each of the piezoelectric actuator chips close to the outer peripheral portion of the wafer 201 according to the above-described Examples 6 through 10 and the above-described Comparative Examples 4 through 6 was measured for the relationships among the maximum difference Δθ1max of the peak position θ1max of the peak position θ1max of the diffraction peak intensity P1 in the nozzle row, the maximum difference Δθ12max of the difference value between the peak position θ1max and the peak position θ2max in the nozzle row, and the displacement amount δ. After the pressurizing liquid chamber 80 was formed on a back surface of a Si wafer on which piezoelectric actuator chips were formed, an electric field of 150 kV/cm was applied in a state in which the nozzle plate 82 was not bonded. The deformation amount at that time was measured as the displacement amount δ by a laser Doppler vibrometer. The piezoelectric constant d31 was calculated by simulation using the results of measurements. After the measurements, each piezoelectric actuator chip was decomposed and analyzed, and the composition analysis of the electromechanical transducer film 24 was conducted by ICP analysis to obtain the maximum difference ΔPb of the composition ratio (Pb/(Zr+Ti)) and the maximum difference ΔTi of the composition ratio (Ti/(Zr+Ti)) of zirconium (Zr) and titanium (Ti) in the element array.

TABLE 2-1

| | Ti/(Zr + Ti) | Pb/(Zr + Ti) | Seed | Variation in Baking temperature |
|---|---|---|---|---|
| Example 6 | 51 | 110 | PT | 3° C. |
| Example 7 | 55 | 110 | PT | 3° C. |
| Example 8 | 45 | 115 | PT | 3° C. |
| Example 9 | 51 | 118 | PT | 10° C. |
| Example 10 | 51 | 102 | PT | 15° C. |
| Comparative Example 4 | 63 | 96 | $TiO_2$ | 25° C. |
| Comparative Example 5 | 43 | 125 | PT | 3° C. |
| Comparative Example 6 | 59 | 115 | PT | 25° C. |

TABLE 2-2

| | ΔTi | ΔPb | $Δθ1_{max}$ | $Δθ12_{max}$ | d31 | $Δδ/δ_{AVE}$ |
|---|---|---|---|---|---|---|
| Example 1 | 0.30% | 3.0% | 0.005 | 0.006 | 145 | 1.5% |
| Example 2 | 0.50% | 3.6% | 0.007 | 0.006 | 132 | 1.6% |
| Example 3 | 0.40% | 3.2% | 0.006 | 0.006 | 128 | 0.5% |
| Example 4 | 0.30% | 9.5% | 0.011 | 0.010 | 140 | 5.2% |
| Example 5 | 0.70% | 9.5% | 0.016 | 0.017 | 138 | 7.4% |
| Comparative Example 1 | 2.30% | 13.5% | 0.035 | 0.041 | 105 | 14.2% |
| Comparative Example 2 | 0.80% | 3.7% | 0.008 | 0.025 | 107 | 1.1% |
| Comparative Example 3 | 2.10% | 12.1% | 0.038 | 0.044 | 119 | 15.8% |

In Table 2-2, when $Δθ1_{max}$ or $Δθ12_{max}$ is equal to or less than 0.02°, the variation of the displacement amount of the diaphragm 22 among the electromechanical transducer elements 200 in the nozzle row can be kept within 8% even at positions close to the outer peripheral portion of the wafer 201 in the piezoelectric actuator chip 202 using the electromechanical transducer film 24 having the crystal structure with the drop A in the rocking curve.

In Examples 6 through 10, the variation $Δδ/δ_{AVE}$ of the displacement amount δ in the nozzle row was within ±8%. For the piezoelectric constant d31, Examples 1 through 5 had properties equivalent to the properties of a general ceramic sintered body (i.e., the piezoelectric constant is in a range from −120 pm/V to −160 pm/V. By contrast, in Comparative Examples 4 and 6, the variation $Δδ/δ_{AVE}$ of the displacement amount δ in the nozzle row was largely deviated from the range of ±8%. For Comparative example 5, a sufficient piezoelectric constant d31 was not obtained and the displacement amount needed for discharging liquid was not obtained.

In addition, liquid discharge heads mounting the piezoelectric actuator chips according to Examples 6 through 10 and the above-described Comparative Examples 4 and 6 were manufactured and evaluated for liquid discharge. In the discharge evaluation, ink having a viscosity of 5 cp was used. A drive voltage of from −10V to −30V was applied by a simple push waveform, and the discharge state was checked. In the discharge evaluation, it was observed that, in any of the liquid discharge heads, ink was discharged from all of the nozzles 81 and high-frequency driving for discharge was performed. On the other hand, for Comparative Example 4 and Comparative Example 6, it was observed that the discharge speed greatly varied in the nozzle row.

Figure 19:
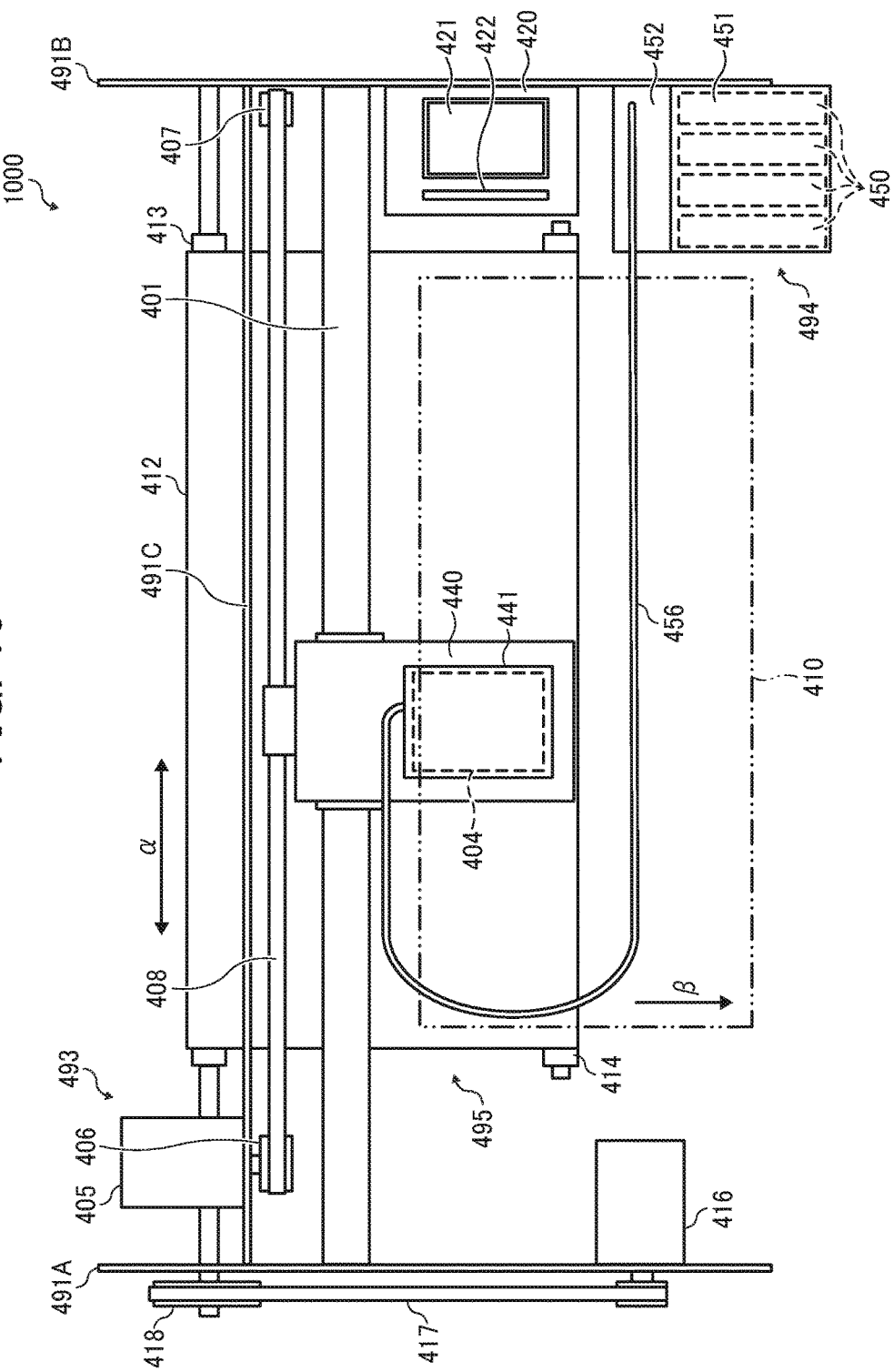
FIG. 19 is a plan view of a portion of an inkjet recording apparatus according to an embodiment of the present disclosure.
Figure 20:
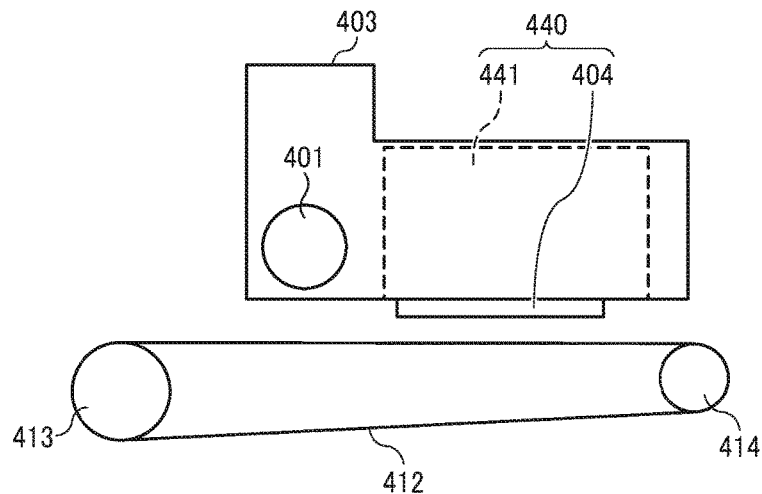
FIG. 20 is a side view of a portion of the inkjet recording apparatus of FIG. 19.

Next, a description is given of an inkjet recording apparatus as an example of the liquid discharge apparatus including the liquid discharge head in the present embodiment. FIG. 19 is a plan view of a portion of the inkjet recording apparatus. FIG. 20 is a side view of a portion of the liquid discharge apparatus of FIG. 19 including a liquid discharge device; In FIG. 19, a main scanning direction is indicated by arrow α, and a sub-scanning direction is indicated by arrow β.

A liquid discharge apparatus 1000 according to the present embodiment is a serial-type apparatus in which a main scan moving unit 493 reciprocally moves a carriage 403 in the main scanning direction α in FIG. 9. The main scan moving unit 493 includes, e.g., a guide 401, a main scanning motor 405, and a timing belt 408. The guide 401 is laterally bridged between a left side plate 491A and a right side plate 491B and supports the carriage 403 so that the carriage 403 is movable along the guide 401. The main scanning motor 405 reciprocally moves the carriage 403 in the main scanning direction α via the timing belt 408 laterally bridged between a drive pulley 406 and a driven pulley 407.

The carriage 403 mounts a liquid discharge device 440 in the present embodiment in which the liquid discharge head 404 and a head tank 441 are integrated as a single unit. The liquid discharge head 404 of the liquid discharge device 440 discharges ink droplets of respective colors of yellow (Y), cyan (C), magenta (M), and black (K). The liquid discharge head 404 is disposed so that a plurality of nozzles 81 constituting each nozzle row are aligned along the sub-scanning direction β perpendicular to the main scanning direction α, to discharge liquid downwardly.

The liquid stored outside the liquid discharge head 404 is supplied to the liquid discharge head 404 via a supply unit 494 that supplies the liquid from a liquid cartridge 450 to the head tank 441.

The supply unit 494 includes, e.g., a cartridge holder 451 as a mount part to mount a liquid cartridge 450, a tube 456, and a liquid feed unit 452 including a liquid feed pump. The liquid cartridge 450 is detachably attached to the cartridge holder 451. The liquid is supplied to the head tank 441 by the liquid feed unit 452 via the tube 456 from the liquid cartridge 450.

The liquid discharge apparatus 1000 includes a conveyance unit 495 to convey a sheet 410. The conveyance unit 495 includes a conveyance belt 412 as a conveyor and a sub-scanning motor 416 to drive the conveyance belt 412.

The conveyance belt 412 electrostatically attracts the sheet 410 and conveys the sheet 410 at a position facing the liquid discharge head 404. The conveyance belt 412 is an endless belt and is stretched between a conveyance roller 413 and a tension roller 414. The sheet 410 is attracted to the conveyance belt 412 by electrostatic force or air aspiration.

The conveyance roller 413 is driven and rotated by the sub-scanning motor 416 via a timing belt 417 and a timing pulley 418, so that the conveyance belt 412 circulates in the sub-scanning direction β.

At one side in the main scanning direction α of the carriage 403, a maintenance unit 420 to maintain and recover the liquid discharge head 404 in good condition is disposed on a lateral side of the conveyance belt 412.

The maintenance unit 420 includes, for example, a cap 421 to cap a nozzle face (a face in which the nozzles 81 are formed) of the liquid discharge head 404 and a wiper 422 to wipe the nozzle face.

The main scan moving unit 493, the supply unit 494, the maintenance unit 420, and the conveyance unit 495 are mounted to a housing that includes the left side plate 491A, the right side plate 491B, and a rear side plate 491C.

In the liquid discharge apparatus 1000 thus configured, a sheet 410 is conveyed on and attracted to the conveyance belt 412 and is conveyed in the sub-scanning direction β by the cyclic rotation of the conveyance belt 412.

The liquid discharge head 404 is driven in response to image signals while the carriage 403 moves in the main scanning direction α, to discharge liquid to the sheet 410 stopped, thus forming an image on the sheet 410.

As described above, the liquid discharge apparatus 1000 includes the liquid discharge head according to the present embodiment, thus allowing stable formation of high-quality images.

Figure 21:
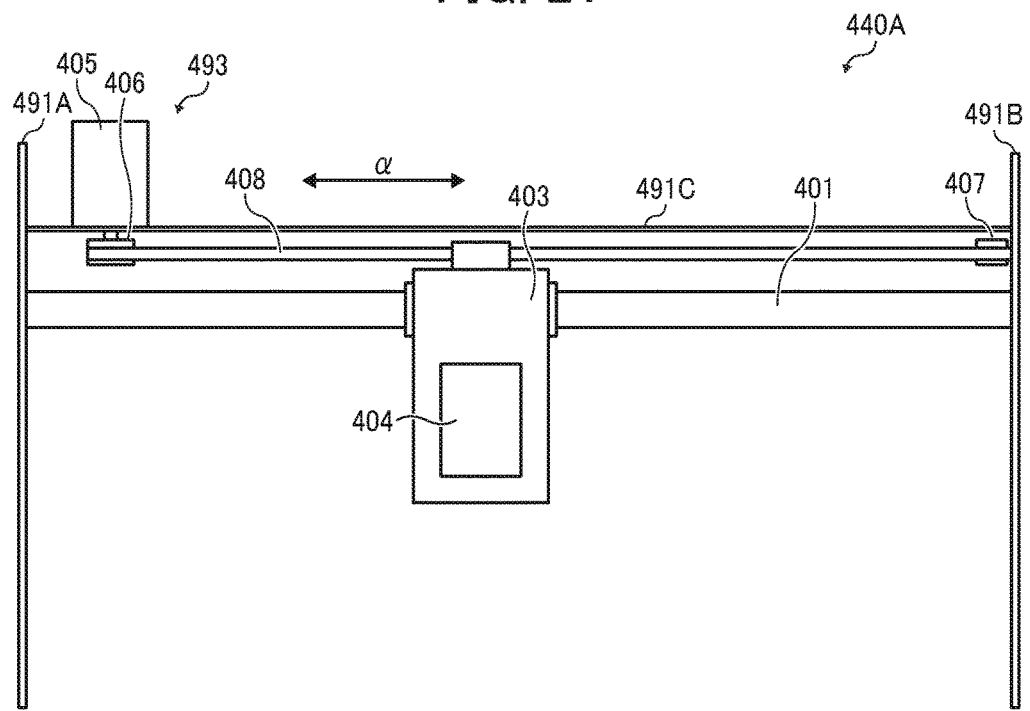
FIG. 21 is a plan view of a portion of another example of a liquid discharge device according to an embodiment of the present disclosure.

Next, another example of the liquid discharge device according to the present embodiment is described with reference to FIG. 21. FIG. 21 is a plan view of a portion of another example of the liquid discharge device (liquid discharge device 440A). In FIG. 21, the main scanning direction is also indicated by arrow α. The liquid discharge device 440A includes the housing, the main scan moving unit 493, the carriage 403, and the liquid discharge head 404 among components of the liquid discharge apparatus 1000. The left side plate 491A, the right side plate 491B, and the rear side plate 491C constitute the housing.

Note that, in the liquid discharge device 440A, at least one of the maintenance unit 420 and the supply unit 494 may be mounted on, for example, the right side plate 491B.

Figure 22:
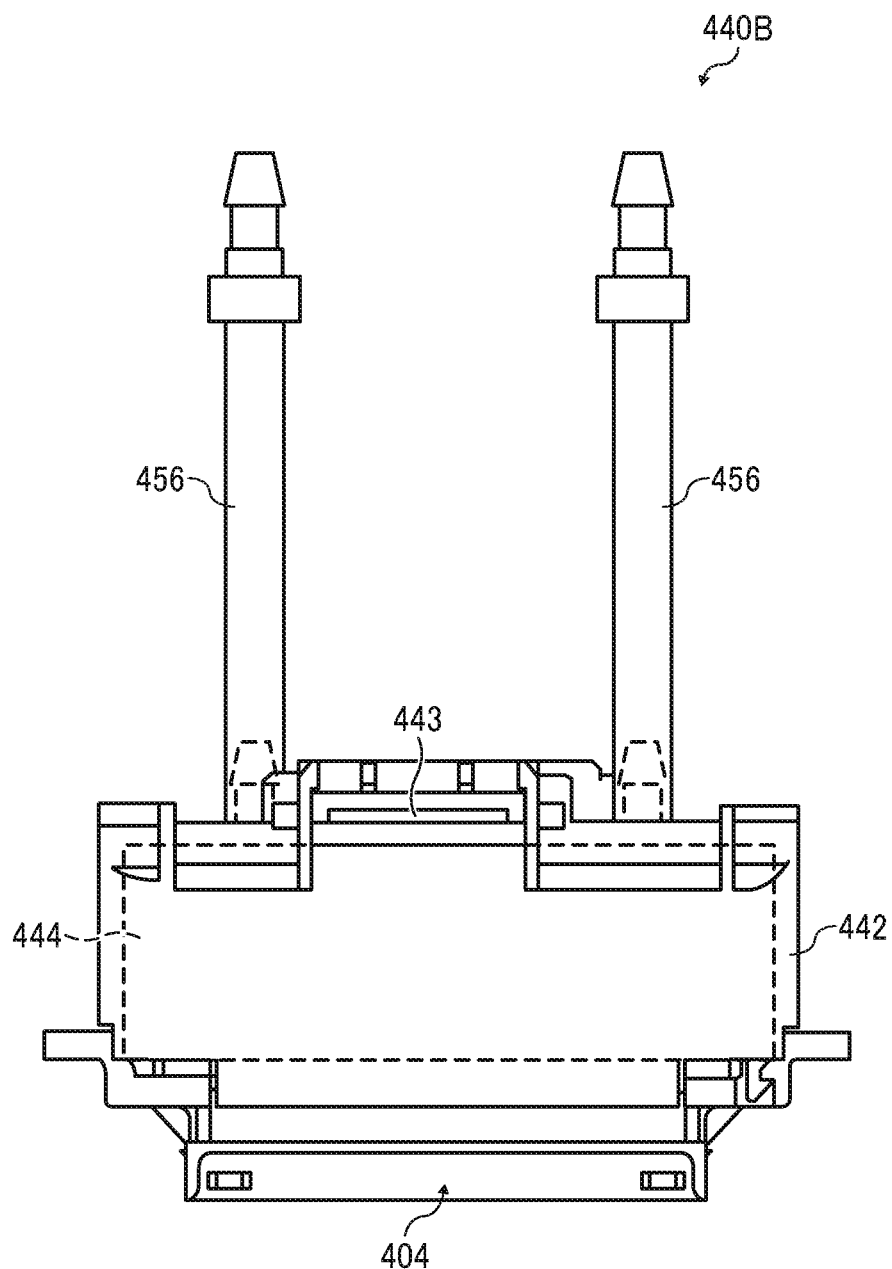
FIG. 22 is a plan view of a portion of still another example of the liquid discharge device according to an embodiment of the present disclosure.

Next, still another example of the liquid discharge device according to the present embodiment is described with reference to FIG. 22. FIG. 22 is a front view of still another example of the liquid discharge device (liquid discharge device 440B).

The liquid discharge device 440B includes the liquid discharge head 404 to which a channel part 444 is mounted, and the tube 456 connected to the channel part 444.

Further, the channel part 444 is disposed inside a cover 442. Instead of the channel part 444, the liquid discharge device 440B may include the head tank 441. A connector 443 to electrically connect the liquid discharge head 404 to a power source is disposed above the channel part 444.

In the present disclosure, the liquid discharge apparatus includes the liquid discharge head or the liquid discharge device, and drives the liquid discharge head to discharge liquid. The liquid discharge apparatus may be, for example, an apparatus capable of discharging liquid to a material to which liquid can adhere and an apparatus to discharge liquid toward gas or into liquid.

The liquid discharge apparatus may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The liquid discharge apparatus may be, for example, an image forming apparatus to form an image on a sheet by discharging ink, or a solid fabrication apparatus (three-dimensional fabricating apparatus) to discharge a fabrication liquid to a powder layer in which powder material is formed in layers, so as to form a solid fabrication object (three-dimensional fabrication object).

The liquid discharge apparatus is not limited to an apparatus to discharge liquid to visualize meaningful images, such as letters or figures. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited.

Examples of the material on which liquid can be adhered include any materials on which liquid can be adhered even temporarily, such as paper, thread, fiber, fabric, leather, metal, plastic, glass, wood, ceramic, construction materials (e.g., wall paper or floor material), and cloth textile.

Examples of the liquid are, e.g., ink, treatment liquid, DNA sample, resist, pattern material, binder, fabrication liquid, or solution and dispersion liquid including amino acid, protein, or calcium.

The liquid discharge apparatus may be an apparatus to relatively move a liquid discharge head and a material on which liquid can be adhered. However, the liquid discharge apparatus is not limited to such an apparatus. The "printing apparatus" may be, for example, a serial-type apparatus to move a liquid discharge head relative to a sheet material or a line-type apparatus that does not move a liquid discharge head relative to a sheet material.

The liquid discharge apparatus may be, e.g., a treatment liquid coating apparatus to discharge a treatment liquid to a sheet to coat the treatment liquid on the surface of the sheet to reform the sheet surface or an injection granulation apparatus in which a composition liquid including raw materials dispersed in a solution is injected through nozzles to granulate fine particles of the raw materials.

The liquid discharge device is an integrated unit including the liquid discharge head and a functional part(s) or unit(s), and is an assembly of parts relating to liquid discharge. For example, the liquid discharge device may be a combination of the liquid discharge head (e.g., the liquid discharge head 404) with at least one of a head tank (e.g., the head tank 441), a carriage (e.g., the carriage 403), a supply unit, a maintenance unit (e.g., the maintenance unit 420), and a main scan moving unit (e.g., the main scan moving unit 493).

Here, examples of the integrated unit include a combination in which the liquid discharge head and a functional part(s) are secured to each other through, e.g., fastening, bonding, or engaging, and a combination in which one of the liquid discharge head and a functional part(s) is movably held by another. The liquid discharge head may be detachably attached to the functional part(s) or unit(s) s each other.

The liquid discharge device may be, for example, a liquid discharge device in which the liquid discharge head and the head tank are integrated as a single unit, such as the liquid discharge device 440 illustrated in FIG. 20. The liquid discharge head and the head tank may be connected each other via, e.g., a tube to form the liquid discharge device as the integrated unit. Here, a unit including a filter may further be added to a portion between the head tank and the liquid discharge head.

In another example, the liquid discharge device may be an integrated unit in which a liquid discharge head is integrated with a carriage.

In still another example, the liquid discharge device may be the liquid discharge head movably held by a guide that forms part of a main-scanning moving device, so that the liquid discharge head and the main-scanning moving device are integrated as a single unit. Like the liquid discharge device 440A illustrated in FIG. 21, the liquid discharge device may be an integrated unit in which the liquid discharge head, the carriage, and the main scan moving unit are integrally formed as a single unit.

In another example, the cap that forms part of the maintenance unit is secured to the carriage mounting the liquid discharge head so that the liquid discharge head, the carriage, and the maintenance unit are integrated as a single unit to form the liquid discharge device.

Like the liquid discharge device 440B illustrated in FIG. 22, the liquid discharge device may be an integrated unit in which the tube is connected to the liquid discharge head mounting the head tank or the channel part so that the liquid discharge head and the supply unit are integrally formed.

The main-scan moving unit may be a guide only. The supply device may include only a tube(s) or a loading unit.

The terms "image formation", "recording", "printing", "image printing", and "fabricating" used herein may be used synonymously with each other.

The above-described embodiments are limited examples, and the present disclosure includes, for example, the following aspects having advantageous effects.

Aspect A

An electromechanical-transducing electronic component, such as the piezoelectric actuator chips 202, includes at least one element array in which a plurality of electromechanical transducer elements, such as the electromechanical transducer elements 200, are arrayed. Each electromechanical transducer element includes at least a first electrode, such as the lower electrode 23, a piezoelectric material, such as the electromechanical transducer film 24, and a second electrode, such as the upper electrode 25, which are laminated one on another. Each electromechanical transducer element applies a voltage according to a drive signal between the first electrode and the second electrode to deform the piezoelectric material. The piezoelectric material of each electromechanical transducer element is made of a composite oxide having a perovskite structure preferentially oriented to at least one of a (100) plane and a (001) plane, and has a drop, such as the drop A, in diffraction intensity in a rocking curve corresponding to at least one of a (200) plane and a (002) plane measured at a position (2θ=θmax) of a diffraction peak intensity P where the diffraction intensity is largest at a peak of diffraction intensity corresponding to the (200) plane out of peaks of diffraction intensity measured by an X-ray diffraction θ-2θ method. The value of $\Delta P/P_{AVE}$ is equal to or less than 20% where $P_{AVE}$ represents an average of the diffraction peak intensity P in each element array in the piezoelectric material of each of the electromechanical transducer elements and ΔP represents the maximum difference of the diffraction peak intensity P in the element array. It has been conventionally considered favorable that, in a piezoelectric material made of a composite oxide having a perovskite structure preferentially oriented in at least one of the (100) plane and the (001) plane, the growth directions of crystal are aligned to increase the amount of displacement by which a displacement plate supporting a first electrode is displaced by piezoelectric effect. As the growth directions of crystal are more aligned, the shape of the rocking curve becomes sharper with a narrow full width at half maximum centered on one peak corresponding to the growth direction. Therefore, piezoelectric materials have been conventionally produced with a narrower full width at half maximum of a rocking curve having one peak. However, the amount of displacement obtained according to the conventional concept is limited, and an electromechanical transducer element offering a larger amount of displacement has been desired. The inventor has diligently conducted studies and found that a piezoelectric material with a drop A in diffraction intensity in a rocking curve corresponding to at least one of a (200) plane and a (002) plane measured at a position (2θ=θmax) of the diffraction peak intensity P where the diffraction intensity is largest at a peak of diffraction intensity corresponding to the (200) plane out of peaks of diffraction intensity measured by an X-ray diffraction θ-2θ method can generate a larger amount of displacement than a conventional piezoelectric material having one peak in a rocking curve. More particularly, the presence of the drop A in the rocking curve means that there are at least two peaks B1 and B2 with the drop between the two peaks. That is, it is considered that the growth directions of crystal in the piezoelectric material are not aligned in one direction but are aligned in two separate directions corresponding to the two peaks. As described above, for the crystal structure in which the crystal in the piezoelectric material includes two or more types of crystal portions having different growth directions, it is considered that, since there are a large number of twin planes, the stress arising in the twin planes advantageously act on deformation of the electromechanical transducer element to increase the displacement amount of the displacement plate (diaphragm). In a conventional piezoelectric material, the growth directions of crystal are aligned in one direction and thus the number of twin planes is smaller, and the displacement plate is displaced without using the stress arising in the twin planes. Therefore, according to the present aspect, it is possible to achieve a large amount of displacement that could not have been achieved by the conventional piezoelectric material. However, even if a large amount of displacement of each electromechanical transducer element is achieved, the variation of the displacement amount may occur among electromechanical transducer elements in the element array. For example, when a plurality of electromechanical-transducing electronic components are produced from a single semiconductor wafer, when different types of films, such as the first electrode, the piezoelectric material, and the second electrode, are formed on the wafer surface, the variation in, e.g., film thickness and film quality occurs in the wafer surface. In particular, the displacement amount of the electromechanical transducer element having the drop A in the rocking curve is affected by the variation (e.g., variation of lattice parameter) in the crystal structure of the piezoelectric material in the wafer surface (e.g., the percentage of twin planes present in the piezoelectric material). In addition, in an area on the wafer surface close to the outer peripheral portion of the wafer, the variation of the crystal structure of the piezoelectric material is likely to greatly change toward the outer peripheral portion of the wafer. Therefore, in the electromechanical-transducing electronic component formed in the area on the wafer surface close to the outer peripheral portion of the wafer, the variation of the displacement amount among the electromechanical transducer elements in the element array may exceed the allowance. In the electromechanical-transducing electronic component according to the present aspect, the ratio $\Delta P/P_{AVE}$ of the maximum difference $\Delta P$ of the diffraction peak intensity P in the element array relative to the average $P_{AVE}$ of the diffraction peak intensity P in the element array in the piezoelectric material of each electromechanical transducer element is equal to or less than 20%. The ratio $\Delta P/P_{AVE}$ is an index value highly correlating to the variation of the crystal structure of the piezoelectric material (e.g., the percentage of twin planes in the piezoelectric material). When the ratio $\Delta P/P_{AVE}$ is equal to or less than 20%, the variation of the crystal structure of the piezoelectric material can be reduced so that the variation of the displacement amount among the electromechanical transducer elements in the element array are within the allowance.

Aspect B

An electromechanical-transducing electronic component, such as the piezoelectric actuator chips 202, includes at least one element array in which a plurality of electromechanical transducer elements, such as the electromechanical transducer elements 200, are arrayed. Each electromechanical transducer element includes at least a first electrode, such as the lower electrode 23, a piezoelectric material, such as the electromechanical transducer film 24, and a second electrode, such as the upper electrode 25, which are laminated one on another. Each electromechanical transducer element applies a voltage according to a drive signal between the first electrode and the second electrode to deform the piezoelectric material. The piezoelectric material of each electromechanical transducer element is made of a composite oxide having a perovskite structure preferentially oriented to at least one of a (100) plane and a (001) plane, and has a drop, such as the drop A, of diffraction intensity in a diffraction intensity profile obtained when the tilt angle ($\chi$) is changed at a position ($2\theta=\theta max$) of a diffraction peak intensity P where the diffraction intensity is largest at a peak of diffraction intensity corresponding to the (200) plane out of peaks of diffraction intensity measured by an X-ray diffraction $\theta$-$2\theta$ method. The value of $\Delta P1/P1_{AVE}$ is equal to or less than 20% where $P1_{AVE}$ represents an average of the diffraction peak intensity P1 of $\chi=0°$ in each element array in the piezoelectric material of each of the electromechanical transducer elements and $\Delta P1$ represents the maximum difference of the diffraction peak intensity P1 in the element array. In the electromechanical-transducing electronic component according to the present aspect, the ratio $\Delta P1/P1_{AVE}$ of the maximum difference $\Delta P1$ of the diffraction peak intensity P1 in the element array relative to the average $P1_{AVE}$ of the diffraction peak intensity P1 of $\chi=0°$ in the element array in the piezoelectric material of each electromechanical transducer element is equal to or less than 20%. Similarly with the above-described ratio $\Delta P/P_{AVE}$, the ratio $\Delta P1/P1_{AVE}$ is an index value highly correlating to the variation of the crystal structure of the piezoelectric material (e.g., the percentage of twin planes in the piezoelectric material). Accordingly, when the ratio $\Delta P1/P1_{AVE}$ is equal to or less than 20%, the variation of the crystal structure of the piezoelectric material can be reduced so that the variation of the displacement amount among the electromechanical transducer elements in the element array are within the allowance.

Aspect C

An electromechanical-transducing electronic component, such as the piezoelectric actuator chips 202, includes at least one element array in which a plurality of electromechanical transducer elements, such as the electromechanical transducer elements 200, are arrayed. Each electromechanical transducer element includes at least a first electrode, such as the lower electrode 23, a piezoelectric material, such as the electromechanical transducer film 24, and a second electrode, such as the upper electrode 25, which are laminated one on another. Each electromechanical transducer element applies a voltage according to a drive signal between the first electrode and the second electrode to deform the piezoelectric material. The piezoelectric material of each electromechanical transducer element is made of a composite oxide having a perovskite structure preferentially oriented to at least one of a (100) plane and a (001) plane, and has a drop, such as the drop A, in diffraction intensity in a post-correction rocking curve obtained by multiplying a value of sine) of each position by the diffraction intensity of a rocking curve corresponding to at least one of a (200) plane and a (002) plane measured at a position ($2\theta=\theta max$) of a diffraction peak intensity P where the diffraction intensity is largest at a peak of diffraction intensity corresponding to the (200) plane out of peaks of diffraction intensity measured by an X-ray diffraction $\theta$-$2\theta$ method. The value of $\Delta P2/P2_{AVE}$ is equal to or less than 20% where P2 represents the diffraction peak intensity at a position corresponding to $\omega=\theta max/2$ in the post-correction rocking curve, $P2_{AVE}$ represents an average of the diffraction peak intensity P2 in each element array in the piezoelectric material of each of the electromechanical transducer elements, and ΔP2 represents the maximum difference of the diffraction peak intensity P2 in the element array. In the electromechanical-transducing electronic component according to the present aspect, the ratio $\Delta P2/P2_{AVE}$ of the maximum difference ΔP2 of the diffraction peak intensity P2 in the element array relative to the average $P2_{AVE}$ of the diffraction peak intensity P2 of ω=θmax/2 of the post-correction rocking curve in the element array in the piezoelectric material of each electromechanical transducer element is equal to or less than 20%. Similarly with the above-described ratio $\Delta P/P_{AVE}$ and the above-described ratio $\Delta P1/P1_{AVE}$, the ratio $\Delta P2/P2_{AVE}$ is an index value highly correlating to the variation of the crystal structure of the piezoelectric material (e.g., the percentage of twin planes in the piezoelectric material). Accordingly, when the ratio $\Delta P2/P2_{AVE}$ is equal to or less than 20%, the variation of the crystal structure of the piezoelectric material can be reduced so that the variation of the displacement amount among the electromechanical transducer elements in the element array are within the allowance.

Aspect D

In any of the above-described aspects A to C, the above-described piezoelectric material is made of lead zirconate titanate (PZT) in which the composition ratio (Ti/(Zr+Ti)) of zirconium (Zr) and titanium (Ti) is in a range of not less than 0.45 and not greater than 0.55. Such a configuration can provide a piezoelectric material capable of obtaining a high piezoelectric constant and achieve a greater displacement amount.

Aspect E

An electromechanical-transducing electronic component, such as the piezoelectric actuator chips 202, includes at least one element array in which a plurality of electromechanical transducer elements, such as the electromechanical transducer elements 200, are arrayed. Each electromechanical transducer element includes at least a first electrode, such as the lower electrode 23, a piezoelectric material, such as the electromechanical transducer film 24, and a second electrode, such as the upper electrode 25, which are laminated one on another. Each electromechanical transducer element applies a voltage according to a drive signal between the first electrode and the second electrode to deform the piezoelectric material. The piezoelectric material of each electromechanical transducer element is made of a composite oxide having a perovskite structure preferentially oriented to at least one of a (100) plane and a (001) plane, and has a drop, such as the drop A, in diffraction intensity in a rocking curve corresponding to at least one of a (200) plane and a (002) plane measured at a position (2θ=θ1max) of a diffraction peak intensity P1 where the diffraction intensity is largest at a peak of diffraction intensity corresponding to the (200) plane out of peaks of diffraction intensity measured by an X-ray diffraction θ-2θ method. The maximum difference Δθ1max of the position θ1max of the above-described diffraction peak intensity P1 in the element array in the piezoelectric material of each electromechanical transducer element is equal to or less than 0.02°. For the electromechanical-transducing electronic component according to the present aspect, the maximum difference Δθ1max of the position θ1max of the diffraction peak intensity P1 in the element array in the piezoelectric material of each electromechanical transducer element is equal to or less than 0.02°. Since the position θ1max of the diffraction peak intensity P1 is highly correlated with the lattice constant of the crystal structure of the piezoelectric material, the maximum difference Δθ1max of the position θ1max in element array is an index value highly correlated with the variation of the crystal structure of the piezoelectric material in the element array. When the maximum difference Δθ1max is equal to or less than 0.02°, the variation of the crystal structure of the piezoelectric material can be reduced so that the variation of the displacement amount among the electromechanical transducer elements in the element array are within the allowance.

Aspect F

An electromechanical-transducing electronic component, such as the piezoelectric actuator chips 202, includes at least one element array in which a plurality of electromechanical transducer elements, such as the electromechanical transducer elements 200, are arrayed. Each electromechanical transducer element includes at least a first electrode, such as the lower electrode 23, a piezoelectric material, such as the electromechanical transducer film 24, and a second electrode, such as the upper electrode 25, which are laminated one on another. Each electromechanical transducer element applies a voltage according to a drive signal between the first electrode and the second electrode to deform the piezoelectric material. The piezoelectric material of each electromechanical transducer element is made of a composite oxide having a perovskite structure preferentially oriented to at least one of a (100) plane and a (001) plane, and has a drop, such as the drop A, in diffraction intensity in a rocking curve corresponding to at least one of a (200) plane and a (002) plane measured at a position (2θ=θ1max) of a diffraction peak intensity P1 where the diffraction intensity is largest at a peak of diffraction intensity corresponding to the (200) plane out of peaks of diffraction intensity measured by an X-ray diffraction θ-2θ method. The maximum difference Δθ12max in the element array of the difference value between the position θ1max of the above-described diffraction peak intensity P1 and a position (2θ=θ2max) of the diffraction peak intensity P2 at which the diffraction intensity is largest in a diffraction intensity peak corresponding to the (111) plane out of diffraction intensity peaks obtained by measurement according to the θ-2θ method of X-ray diffraction, in the piezoelectric material of each electromechanical transducer element is equal to or less than 0.02°. In the electromechanical-transducing electronic component according to the present aspect, the maximum difference Δθ12max in the element array of the difference value between the peak position θ2max of the diffraction peak intensity P2 corresponding to the (111) plane and the peak position θ1max of the diffraction peak intensity P1 corresponding to the (200) plane and/or the (002) plane, in the piezoelectric material of each electromechanical transducer element is equal to or less than 0.02°. Similarly with the above-described maximum difference Δθ1max, the maximum difference Δθ12max is also an index value highly correlating to the variation of the crystal structure of the piezoelectric material (e.g., variation of the lattice constant). Accordingly, when the maximum difference Δθ12max is equal to or less than 0.02°, the variation of the crystal structure of the piezoelectric material can be reduced so that the variation of the displacement amount among the electromechanical transducer elements in the element array are within the allowance.

Aspect G

In the above-described aspect E or F, the above-described piezoelectric material is made of lead zirconate titanate (PZT) in which the maximum difference ΔPb of the composition ratio (Pb/(Zr+Ti)) of lead (Pb), zirconium (Zr), and titanium (Ti) in the element array is equal to or less than 10%. Such a configuration can reduce the variation of the crystal structure of the piezoelectric material so that the variation of the displacement amount among the electromechanical transducer elements in the element array are within the allowance.

Aspect H

In any one of the above-described aspects E to G, the above-described piezoelectric material is made of lead zirconate titanate (PZT) in which the average $Pb_{AVE}$ of the composition ratio (Pb/(Zr+Ti)) of lead (Pb), zirconium (Zr), and titanium (Ti) in the element array is in a range of not less than 100% and not greater than 120%. Such a configuration can reduce the variation of the crystal structure of the piezoelectric material so that the variation of the displacement amount among the electromechanical transducer elements in the element array are within the allowance.

Aspect I

In any one of the above-described aspects E to H, the above-described piezoelectric material is made of lead zirconate titanate (PZT) in which the maximum difference ΔTi of the composition ratio (Ti/(Zr+Ti)) of lead (Pb), zirconium (Zr), and titanium (Ti) in the element array is equal to or less than 2%. Such a configuration can reduce the variation of the crystal structure of the piezoelectric material so that the variation of the displacement amount among the electromechanical transducer elements in the element array are within the allowance.

Aspect J

In any one of the above-described aspects E to I, the above-described piezoelectric material is made of lead zirconate titanate (PZT) in which the average $Ti_{AVE}$ of the composition ratio (Ti/(Zr+Ti)) of lead (Pb), zirconium (Zr), and titanium (Ti) in the element array is in a range of not less than 45% and not greater than 55%. Such a configuration can reduce the variation of the crystal structure of the piezoelectric material so that the variation of the displacement amount among the electromechanical transducer elements in the elementa array are within the allowance.

Aspect K

In any one of Aspects A to J, the electromechanical transducer element includes a seed layer made of lead titanate between the piezoelectric material and the first electrode. Such a configuration can achieve a piezoelectric material providing a large amount of displacement.

Aspect L

In any one of the above-described aspects A to K, the average $\rho_{AVE}$ of the orientation degree ρ of at least one of the (100) plane and the (001) plane in each element array in the piezoelectric material of each electromechanical transducer element is equal to or greater than 95%. Such a configuration can achieve a piezoelectric material providing a large amount of displacement.

Aspect M

In any of the above-described aspects A to L, the value of $\Delta\delta/\delta_{AVE}$ is equal to or less than 8%, where $\delta_{AVE}$ represents the average value of the displacement amount δ in each element array on application of an electric field having an intensity of 150 kV/cm and Δδ represents a maximum difference of the displacement amount δ in the element array. Such a configuration can reduce the variation of the displacement amount in the element array in which electromechanical transducer elements are arrayed.

Aspect N

A liquid discharge head, such as the liquid discharge head 404, includes a plurality of discharge orifices, such as the nozzles 81, arrayed to discharge liquid, such as ink, a plurality of liquid chambers, such as the pressurizing liquid chamber 80, communicated with the discharge orifices, a displacement plate, such as the diaphragm 22, constituting at least one wall of each of the liquid chambers, and the electromechanical-transducing electronic component, such as the piezoelectric actuator chip 202, according to any one of Aspects A to M including a plurality of electromechanical transducer elements, such as the electromechanical transducer elements 200, corresponding to the respective discharge orifices to displace the displacement plate in accordance with drive signals. Such a configuration can achieve a liquid discharge head having less variation of discharging performance in a discharge orifice array.

Aspect O

A liquid discharge device, such as the liquid discharge device 440, includes the liquid discharge head, such as the liquid discharge head 404, according to Aspect N to discharge liquid from the discharge orifices according to drive signals and at least one external component, such as the head tank 441, integrated with the liquid discharge head as a single unit. Such a configuration can achieve a liquid discharge device having less variation of discharging performance in a discharge orifice array.

Aspect P

In the liquid discharge device according to the above-described aspect O, the external component includes at least one of a head tank, such as the head tank 441, to store the liquid to be supplied to the liquid discharge head, a carriage, such as the carriage 403, to mount the liquid discharge head thereon, a supply unit, such as the supply unit 494, to supply the liquid to the liquid discharge head, a maintenance unit, such as the maintenance unit 420, to maintain and recover the liquid discharge head, and a moving unit, such as the main scan moving unit 493, to move the liquid discharge head. Such a configuration can achieve various types of liquid discharge devices having less variation of discharging performance in a discharge orifice array.

Aspect Q

A liquid discharge apparatus, such as the liquid discharge apparatus 1000, includes the liquid discharge head according to Aspect N to discharge liquid from the discharge orifices in accordance with drive signals. Such a configuration can achieve a liquid discharge apparatus having less variation of discharging performance in a discharge orifice array.

Numerous additional modifications and variations are possible in light of the above teachings. It is therefore to be understood that, within the scope of the above teachings, thepresent disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An electromechanical-transducing electronic component comprising at least one element array in which a plurality of electromechanical transducer elements are arrayed, each of the plurality of electromechanical transducer elements including:
   a first electrode;
   a piezoelectric material on the first electrode; and
   a second electrode on the piezoelectric material,
   each of the plurality of electromechanical transducer elements configured to apply a voltage according to a drive signal between the first electrode and the second electrode to deform the piezoelectric material, wherein the piezoelectric material is made of a composite oxide having a perovskite structure preferentially oriented to at least one of a (100) plane and a (001) plane, and the piezoelectric material has a drop between peaks of diffraction intensity, measured by an X-ray diffraction θ-2θ method, in a rocking curve corresponding to at least one of a (200) plane and a (002) plane measured at a position (2θ=θmax) of a diffraction peak intensity P where the diffraction intensity is largest in a diffraction intensity peak corresponding to the at least one of the (200) plane and the (002) plane, wherein $\Delta P/P_{AVE}$ is equal to or less than 20% where $P_{AVE}$ represents an average of the diffraction peak intensity P in each of the at least one element array in the piezoelectric material of each of the plurality of electromechanical transducer elements and $\Delta P$ represents a maximum difference of the diffraction peak intensity P in each of the at least one element array.

2. The electromechanical-transducing electronic component according to claim 1, wherein the piezoelectric material is made of lead zirconate titanate (PZT) in which a composition ratio (Ti/(Zr+Ti)) of zirconium (Zr) and titanium (Ti) is in a range of not less than 0.45 and not greater than 0.55.

3. The electromechanical-transducing electronic component according to claim 1, wherein each of the plurality of electromechanical transducer elements includes a seed layer made of lead titanate between the piezoelectric material and the first electrode.

4. The electromechanical-transducing electronic component according to claim 1, wherein an average $\rho_{AVE}$ of an orientation degree ρ of at least one of the (100) plane and the (001) plane in the at least one element array in the piezoelectric material of each of the plurality of electromechanical transducer elements is equal to or greater than 95%.

5. The electromechanical-transducing electronic component according to claim 1, wherein $\Delta\delta/\delta_{AVE}$ is equal to or less than 8%, where $\delta_{AVE}$ represents an average of a displacement amount δ in each of the at least one element array on application of an electric field having an intensity of 150 kV/cm and $\Delta\delta$ represents a maximum difference of the displacement amount δ in each of the at least one element array.

6. A liquid discharge head comprising:
a plurality of discharge orifices arrayed to discharge liquid;
a plurality of liquid chambers communicated with the plurality of discharge orifices;
a displacement plate constituting at least one wall of the plurality of liquid chambers; and
the electromechanical-transducing electronic component according to claim 1 including the plurality of electromechanical transducer elements corresponding to the plurality of discharge orifices to displace the displacement plate in accordance with drive signals.

7. A liquid discharge device comprising:
the liquid discharge head according to claim 6 to discharge liquid from the plurality of discharge orifices according to the drive signals; and
at least one external component integrated with the liquid discharge head.

8. The liquid discharge device according to claim 7, wherein the external component includes at least one of a head tank to store the liquid to be supplied to the liquid discharge head, a carriage to mount the liquid discharge head, a supply unit to supply the liquid to the liquid discharge head, a maintenance unit to maintain the liquid discharge head, and a moving unit to move the liquid discharge head.

9. A liquid discharge apparatus comprising the liquid discharge head according to claim 6 to discharge the liquid from the plurality of discharge orifices according to the drive signals.

10. The electromechanical-transducing electronic component according to claim 1, wherein the first electrode includes a metal layer and an oxide electrode film contacting the piezoelectric material, and the second electrode includes a metal layer and an oxide electrode film contacting the piezoelectric material.

* * * * *